(12) United States Patent
Hasegawa et al.

(10) Patent No.: US 6,853,521 B2
(45) Date of Patent: Feb. 8, 2005

(54) EXCHANGE COUPLING FILM HAVING IMPROVED WETTABILITY OF SEED LAYER

(75) Inventors: Naoya Hasegawa, Niigata-ken (JP); Masamichi Saito, Niigata-ken (JP); Kenichi Tanaka, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 115 days.

(21) Appl. No.: 10/197,123

(22) Filed: Jul. 17, 2002

(65) Prior Publication Data

US 2003/0030434 A1 Feb. 13, 2003

(30) Foreign Application Priority Data

Jul. 19, 2001 (JP) ........................ 2001-219439

(51) Int. Cl.[7] .................. G11B 5/127; G11B 5/39
(52) U.S. Cl. ............... 360/324.11; 428/611; 428/663; 428/667; 428/336; 428/692
(58) Field of Search ................. 428/611, 663, 428/666, 667, 141, 332, 336, 409, 692; 360/324, 324.1, 324.11, 324.12

(56) References Cited

FOREIGN PATENT DOCUMENTS

JP           2000-22239        1/2000

*Primary Examiner*—Paul Thibodeau
*Assistant Examiner*—Kevin M. Bernatz
(74) *Attorney, Agent, or Firm*—Brinks Hofer Gilson & Lione

(57) ABSTRACT

A seed layer is formed with a Cr layer in which the direction of a crystal face in at least one crystal grain is oriented in a different direction from the direction of an equivalent crystal face in another crystal grain. Consequently, wettability of the seed layer can be markedly improved and the unidirectional exchange bias magnetic field in a pinned magnetic layer can be increased while permitting the surface of each layer on the seed layer to have good lubricity.

51 Claims, 12 Drawing Sheets

CRISTAL GRAIN BOUNDARY    CRISTAL GRAIN BOUNDARY

EXCHANGE COUPLING FILM HAVING IMPROVED WETTABILITY OF SEED LAYER

BACKGROUND OF THE INVENTION

1. Field of the Invention

The present invention relates to an exchange coupling film comprising, from the bottom to the top, a seed layer, an antiferromagnetic layer and a ferromagnetic layer in which the magnetization direction of the ferromagnetic layer is aligned in a given direction due to an exchange coupling magnetic field generated at the interface between the antiferromagnetic layer and ferromagnetic layer, and to a magnetic sensing element (such as a spin-valve type thin film element and an AMR element) using the exchange coupling film. In particular, the present invention relates to an exchange coupling film capable of more properly improving electromigration resistance in high density recording in the future as compared with that in the related art, while enabling a favorable rate of change of resistance to be obtained, and to a magnetic sensing element using the exchange coupling film.

2. Description of the Related Art

FIG. 13 shows a partial cross section of a conventional magnetic sensing element (spin-valve type thin film element) cut from a direction parallel to an opposed face to a recording medium.

The reference numeral 14 shown in FIG. 13 denotes a seed layer made of, for example, a NiFeCr alloy. An antiferromagnetic layer 30, a pinned magnetic layer 31, a nonmagnetic layer 32, a free magnetic layer 33 and a protective layer 7 are sequentially laminated on the seed layer 14.

An exchange coupling magnetic field is generated in this type of the spin-valve type thin film element at an interface between the antiferromagnetic layer 30 and pinned magnetic layer 31 by a heat treatment, and magnetization of the pinned magnetic layer 31 is fixed in the height direction (the Y-direction in the drawing).

Hard bias layers 5 are formed at both sides of the multilayer from the seed layer 14 to the protective layer 7 as shown in FIG. 13. Magnetization of the free magnetic layer 33 is aligned in the track width direction (the X-direction in the drawing) by a transverse bias magnetic field from the hard bias layer 5.

As shown in FIG. 13, an electrode layer 8 is formed so as to cover the hard bias layer 5. A sense current from the electrode layer 8 mainly flows through three layers of the pinned magnetic layer 31, non-magnetic layer 32 and free magnetic layer 33.

The seed layer 14 is formed under the antiferromagnetic layer 30 in the spin-valve type thin film element shown in FIG. 13, because improvements of electromigration resistance represented by the electromigration resistance and the rate of change of resistance could be expected by providing the seed layer 14.

It has been emphasized in the related art that the crystal structure of the seed layer 14 is a face-centered cubic structure (a fcc structure).

Layers formed on the seed layer 14 may be properly oriented in the [111] direction and the crystal grain size may be increased when the seed layer 14 has the face-centered cubic structure. As a result, electric conductance may be increased by decreasing scattering of conduction electrons at crystal grain boundaries while increasing the exchange coupling magnetic field generated between the pinned magnetic layer 31 and antiferromagnetic layer 30 to enable improved electromigration resistance to be expected.

The seed layer 14 was been formed of the NiFeCr alloy with a Cr composition ratio of 40 at %, in order to maintain the crystal structure of the seed layer 14 as the face-centered cubic structure.

However, the sense current density flowing through the spin-valve type thin film element has increased as the spin-valve type thin film element is compacted for complying with high density recording in the future, thereby arising a problem of electromigration.

The inventors of the present invention have thought it important to contemplate improving wettability of the surface of the seed layer 14 in contact with the antiferromagnetic layer 30 for solving the problems as hitherto described. It was conjectured that atoms in an antiferromagnetic material constituting the antiferromagnetic layer 30 may be hardly coagulated on the seed layer 14 having good wettability when the antiferromagnetic layer 30 is deposited on the seed layer 14 by sputtering, which results in a large crystal grain diameter to enable the exchange coupling magnetic field generated between the antiferromagnetic layer 30 and pinned magnetic layer 31 as well as the rate of change of resistance to be increased.

While the larger the composition ratio of Cr incorporated in the seed layer 14 is supposed to be favorable for improving wettability, increasing the composition ratio of Cr too much results in precipitation of a body-centered cubic structure (bcc structure) mingled with the face-centered cubic structure (fcc structure), thereby decreasing less of an improvement of wettability than expected. Consequently, the exchange coupling magnetic field generated between the pinned magnetic layer 31 and antiferromagnetic layer 30 rather decreases to make it impossible to improve electromigration resistance, which is represented by electromigration resistance, as well as the rate of change of resistance.

Electromigration resistance and the rate of change of resistance were forced to be decreased unless the composition ratio of Cr is adjusted to be 40 at % or less, when the seed layer 14 is formed of the NiFeCr alloy as in the related art. Furthermore, it was revealed that using the NiFeCr alloy for the seed layer 14 makes it difficult to contemplate obtaining a higher exchange coupling magnetic field for further improving electromigration resistance and the rate of change of resistance in compliance with high recording density in the future.

In addition, using the NiFeCr alloy (with a Cr composition ratio of 40 at % or less) in the seed layer 14 have caused the problems to be described hereinafter to arise because lubricity of the surface of the antiferromagnetic layer 30 decreases due to undulations generated on the surface of the antiferromagnetic layer 30.

FIG. 14 illustrates a partially magnified drawing of the structure of the magnetic sensing element shown in FIG. 13. The seed layer 14 shown in FIG. 14 is formed of the NiFeCr alloy with a Cr composition ratio of 40 at % or less.

FIG. 14 shows the surface 30a having undulations formed on the antiferromagnetic layer 30. These undulations also appear on the surfaces of the pinned magnetic layer 31, nonmagnetic layer 32 and free magnetic layer 33 formed over the antiferromagnetic layer 30.

Magnetic poles are generated at undulated portions on the surface of the pinned magnetic layer 31 as shown in FIG. 15 (a schematic cross section obtained by cutting the pinned magnetic layer 31, nonmagnetic layer 32 and free magnetic layer 33 in the Y-direction shown in FIG. 14) by generation of undulations as described above. The magnetic poles also appear at undulated portions of the free magnetic layer 33 opposed to the pinned magnetic layer 31 with intervention of the nonmagnetic layer 32, thereby increasing an interlayer coupling magnetic field ($H_{in}$) caused by a static magnetic coupling (topological coupling) between the pinned magnetic layer 31 and free magnetic layer 33. Accordingly, an action for magnetizing in the Y direction is exerted on the free magnetic layer 33 that should be naturally magnetized in the X-direction, causing a problem in that asymmetry in the regenerative waveform is increased.

When a specular reflection layer is formed on the free magnetic layer 33 formed of, for example, an oxide of Ta, on the other hand, lubricity of the surface of the specular reflection layer is also inhibited by being affected by the undulation of the surface 30a of the antiferromagnetic layer 30 to decrease specular reflectivity of the specular reflection layer, making it impossible to expect an increased rate of change of resistance caused by the specular effect.

The inventors of the present invention have presumed that the problems arising from surface undulation on the surface of each layer formed on the seed layer 14 comes from poor wettability of the seed layer 14 and crystal orientation.

SUMMARY OF THE INVENTION

Accordingly, the object of the present invention for solving the problems as hitherto described is to provide an exchange coupling film and a magnetic sensing element using the exchange coupling film particularly by forming a seed layer with Cr and by properly adjusting crystal orientation of the seed layer, whereby wettability of the seed layer is improved, a larger unidirectional exchange bias magnetic field (Hex*) can be obtained in the ferromagnetic layer while reducing undulation on the surface of each layer as compared with the conventional layers formed on the seed layer using the NiFeCr alloy, and electromigration resistance and the rate of change of resistance can be properly improved.

The present invention provides an exchange coupling film comprising a seed layer, an antiferromagnetic layer and a ferromagnetic layer sequentially laminated from the bottom to the top. The magnetization direction of the ferromagnetic layer is aligned in a given direction by generating an exchange coupling magnetic field at the interface between the antiferromagnetic layer and ferromagnetic layer. The seed layer is formed of Cr and contains an amorphous phase in at least a part thereof, and the direction of a crystal face in at least one region of the seed layer is oriented in a direction different from the direction of a crystal face in another region of the seed layer.

Different from the related art, the seed layer is formed of Cr in the present invention. While wettability of the seed layer had been considered to be improved by increasing the composition ratio of Cr when the seed layer is formed of a NiFeCr alloy, the exchange coupling magnetic field generated between the antiferromagnetic layer and ferromagnetic layer rapidly decreased, on the contrary, by increasing the composition ratio of Cr to 40 at % or more, and electromigration resistance could not be properly improved.

It was revealed that wettability on the surface of the seed layer could be markedly improved by forming the seed layer as a monolayer of Cr in the present invention, as compared with the conventional seed layer formed of the NiFeCr alloy. Wettability is improved by increasing the surface energy to activate the surface. Wettability is also supposed to be increased by allowing a crystal surface formed in one region of the seed layer to orient in a different direction from the direction of another equivalent crystal face formed in another region of the seed layer, thereby reducing crystal orientation in a direction parallel to the surface of the layer. However, wettability cannot be sufficiently improved merely by forming the seed layer with Cr, and film deposition conditions, particularly the surface temperature of the substrate on which the seed layer is formed, the distance between the substrate and target, the Ar gas pressure for forming the seed layer, and sputtering speed also serve as crucial factors.

According to the present invention, each layer such as an antiferromagnetic layer deposited on the seed layer is made to be ready for lamellar growth by remarkably improving wettability of the surface of the seed layer. Consequently, the crystal grain diameter becomes larger, and the unidirectional exchange bias magnetic field (Hex*) in the ferromagnetic layer is more increased as compared with the conventional seed layer made of the NiFeCr alloy.

The unidirectional exchange bias magnetic field (Hex*) as used herein is defined as the magnitude of the external magnetic field when the rate of change of resistance ($\Delta R/R$) decreases to half of its maximum value. The unidirectional exchange coupling magnetic field includes the magnitude of an exchange coupling magnetic field generated between the ferromagnetic layer and antiferromagnetic layer, as well as the magnitude of a coupling magnetic field due to RKKY mutual exchange coupling generated between magnetic layers having a laminated ferrimagnetic structure, when the ferromagnetic layer has the ferrimagnetic structure.

Accordingly, the unidirectional exchange coupling bias magnetic field principally means an exchange coupling magnetic field generated between the ferromagnetic layer and antiferromagnetic layer when the ferromagnetic layer according to the present invention is not in the laminated ferrimagnetic structure, while the unidirectional exchange coupling bias magnetic field principally means a magnetic field as a sum of the exchange coupling magnetic field and the exchange magnetic field in the RKKY mutual exchange coupling.

The ferromagnetic layer may be properly pinned in a given direction by increasing the unidirectional exchange bias magnetic field. Electromigration resistance represented by an improvement of electromigration resistance may be properly improved by, for example, maintaining the ferromagnetic layer (for example the pinned magnetic layer) to be fixed in a desired direction even in a high temperature environment.

Meanwhile, crystal orientation in the seed layer is properly adjusted in the present invention by forming the seed layer with Cr.

The crystal face at least in one region of the seed layer is different from the orientation of the crystal face in another region in the seed layer.

For example, it is preferable in the present invention that the orientation of the crystal face in one crystal grain on the seed layer is different from the orientation of the crystal face in another crystal grain in the seed layer.

In other words, all the crystal faces equivalent with each other are not preferentially oriented strongly in a direction parallel to the surface on the surface of the seed layer. Instead, the crystal face in one crystal grain on the surface of the seed layer is not oriented parallel to the surface of the layer, and crystal orientation in the direction parallel to the layer surface is weakened on the surface of the seed layer.

The (111) face of the seed layer has been considered to be preferably oriented in a direction parallel to the layer surface. However, atoms constituting the antiferromagnetic layer suffer so strong constraint force by crystal orientation of the seed layer that the atoms are not effectively movable on the surface of the seed layer when the antiferromagnetic layer is deposited on the seed layer, since crystals are strongly oriented in the direction parallel to the layer surface and wettability of the seed layer made of the NiFeCr alloy is not so good in the related art. Consequently, a properly uniform antiferromagnetic layer is hardly deposited on the seed layer to arise undulations on the surface of the antiferromagnetic layer.

On the other hand, wettability of the surface of the seed layer is remarkably improved and crystal orientation of the seed layer in the direction parallel to the layer surface is weak in the present invention. Therefore, the atoms constituting the antiferromagnetic layer are able to effectively move on the surface of the seed layer during the process for depositing the antiferromagnetic layer on the seed layer, since crystal orientation of the seed layer hardly inhibit the atoms from moving. Consequently, the antiferromagnetic layer is uniformly deposited on the seed layer, enabling lubricity of the surface of the antiferromagnetic layer to be improved over the related art.

Improving lubricity of the surface of each layer formed on the surface of the seed layer permits a ferromagnetic coupling (interlayer coupling magnetic field, $H_{in}$) caused by a static magnetic coupling (topological coupling) between the pinned magnetic layer (ferromagnetic layer) and free magnetic layer to be weakened and asymmetry of a regenerative waveform to be reduced. In addition, when a specular reflection layer is formed, the rate of change of resistance may be improved by improving specular reflectivity of the specular reflection layer.

According to the exchange coupling film in the present invention, wettability may be remarkably improved over the conventional one, and lubricity of the surface of each layer formed on the seed layer can be improved. Accordingly, the uniaxial exchange bias magnetic field (Hex*) can be increased over that in the related art, thereby enabling electromigration resistance in high density recording in the future to be improved while stabilizing the regenerative waveform. It is also possible to improve the rate of change of resistance to an extent comparable to or more than that in the related art by increasing the crystal gain diameter.

Diffraction spots corresponding to reciprocal lattice points representing the equivalent crystal faces are seen in the present invention on the electron diffraction patterns measured at one region and at a different region. The inclined angle of each virtual line from the line normal to the layer surface, obtained by connecting each diffraction spot and the origin of the beam, is within an angle of zero to 45 degree, and at least a part of crystal axes or equivalent axes thereof in the crystal face are preferably oriented in different directions with each other.

Diffraction spots corresponding to the reciprocal lattice points representing the equivalent crystal faces between one region and another region are seen in the electron diffraction pattern as described above. While the antiferromagnetic layer formed on the seed layer is ready for epitaxial growth when shift of the inclined angle of each virtual line from the line normal to the layer surface, obtained by connecting each diffraction spot and the origin of the beam, is within an angle of zero to 45 degree, the crystal face is rotated around a crystal axis vertical to the crystal face. Consequently, at least a part of the crystal axes laying in the crystal face are oriented in different directions among the crystal faces.

The atoms constituting the antiferromagnetic layer are not in a 1:1 correspondence relation to the atoms constituting the seed layer and tends to be in a non-coherent state with each other, when the relations among the crystal axes are as described above. Therefore, the antiferromagnetic layer may properly transform from a disordered lattice to an ordered lattice, generating a large exchange coupling magnetic field between the antiferromagnetic layer and ferromagnetic layer.

The crystal face is preferably an equivalent crystal face represented by [110] faces in the present invention.

The equivalent crystal face represented by the [110] faces include (110), (1-10), (-110), (-1-10), (101), (10-1) (-101), (-10-1), (011), (01-1), (0-11) and (0-1-1) faces. These crystal faces indicate the crystal faces (real lattice face, or reciprocal lattice point in the diffraction image) in a single crystal structure represented by Miller indices. Any one of these crystal faces are represented by the [110] face.

It is preferable in the present invention that an under layer formed of at least one element of Ta, Hf, Nb, Zr, Ti, Mo and W is formed under the seed layer.

Since the surface of the underlayer formed of Ta and the like has relatively good wettability, the seed layer formed of Cr may be more densely deposited on the entire surface of the underlayer, thereby enabling wettability of the surface of the seed layer to be properly improved.

In addition, it was confirmed by the experiment to be described hereinafter that the permissible range of the thickness of the seed layer for obtaining a given magnitude of the unidirectional exchange bias magnetic field (Hex*) and rate of change of resistance ($\Delta R/R$) may be expanded by forming the under layer as compared with the case having no such underlayer.

The seed layer is preferably formed with a thickness of 15 Å or more and 60 Å or less, when the underlayer formed of at least one element of Ta, Hf, Nb, Zr, Ti, Mo and W is provided under the seed layer.

The seed layer cannot have good wettability and planarity when the thickness of the seed layer is less than 15 Å, because a dense seed layer with a uniform thickness cannot be sufficiently grown. Consequently, crystal orientations of the antiferromagnetic layer and ferromagnetic layer laminated on the seed layer become insufficient with a small mean crystal grain diameter while decreasing the rate of change of resistance ($\Delta R/R$) and unidirectional exchange coupling bias magnetic field (Hex*), thereby increasing the interlayer coupling magnetic field ($H_{in}$).

It is also not preferable that the thickness of the seed layer is larger than 60 Å, since the proportion of shunt of the sense current to the seed layer increases to cause a rapid decrease of the rate of change of resistance ($\Delta R/R$).

The thickness of the seed layer of 15 Å or more and 60 Å or less permits the rate of change of resistance ($\Delta R/R$) to be 9% or more and the unidirectional coupling bias magnetic field (Hex*) to be about $11.85 \times 10^4$ A/m. The seed layer may properly contain a crystalline phase, and the crystalline phase of the seed laye has a body-centered cubic structure (bcc structure).

Alternatively, the seed layer is preferably formed with a thickness of 20 Å or more and 60 Å or less. The seed layer may be densely and uniformly grown with a proper wettability by adjusting the thickness of the seed layer to 20 Å or more.

Forming the seed layer with the thickness of 20 Å or more and 60 Å or less permits the rate of change of resistance (ΔR/R) to be 9% or more and the unidirectional excahnge bias magnetic field (Hex*) to be about $15.8 \times 10^4$ A/m or more. The interlayer coupling magnetic field ($H_{in}$) may also come extremely close to zero A/m.

It is further preferable in the present invention to form the seed layer with a thickness of 50 Å or more and 60 Å or less.

The crystal structure of the seed layer may comprise a perfect crystalline phase by forming the seed layer with a thickness of 50 Å or more. The orientation of the crystal face in at least one region of the seed layer may be different from the orientation of the crystal face in another region of the seed layer. In addition, the crystal faces are rotated around a crystal axis perpendicular to the crystal face with each other, and at least a part of the equivalent crystal axes laying in the crystal face (for example the <001> axis when the crystal face is a {110} face) are oriented in different directions with each other. The crystalline phase has the body-centered cubic structure (bcc structure).

As hitherto described, the rate of change of resistance (ΔR/R) may be 9% or more and the unidirectional exchange bias magnetic field (Hex*) may be about $15.8 \times 10^4$ A/m or more by adjusting the thickness of the seed layer to 50 Å or more and 60 Å or less, thereby enabling the interlayer coupling magnetic field ($H_{in}$) to come extremely close to zero A/m.

The seed layer is preferably formed with a thickness of 25 Å or more and 60 Å or less, when no underlayer comprising at least one of the elements of Ta, Hf, Nb, Zr, Ti, Mo and W is provided under the seed layer.

Since a dense seed layer with a uniform thickness cannot be sufficiently grown when the thickness of the seed layer is 25 Å or less, the surface of the seed layer has poor wettability and planarity with an insufficient crystal orientation and small mean crystal grain diameter in the antiferromagnetic layer and ferromagnetic layer formed on the seed layer, thereby increasing the rate of change of resistance (ΔR/R) and unidirectional exchange bias magnetic field (Hex*) while increasing the interlayer coupling magnetic field ($H_{in}$).

Forming the seed layer with a thickness in the range of 25 Å or more and 60 Å or less permits the rate of change of resistance (ΔR/R) to be 9% or more and the unidirectional exchange bias magnetic field (Hex*) to be about $11.85 \times 10^4$ A/m while enabling the crystalline phase to be incorporated in the layer structure. The crystalline phase has, for example, the body-centered cubic structure (bcc structure).

The seed layer is more preferably formed with a thickness of 30 Å or more and 60 Å or less in the present invention. A uniform seed layer may be densely grown by adjusting the thickness of the seed layer to 30 Å or more, thereby enabling wettability of the surface of the layer to be properly improved.

Forming the seed layer with a thickness of 30 Å or more and 60 Å or less permits the rate of change of resistance (ΔR/R) to be 9% or more and the unidirectional exchange bias magnetic field (Hex*) to be about $15.8 \times 10^4$ A/m or more. The interlayer coupling magnetic field ($H_{in}$) may be also made to infinitely come close to zero A/m.

The seed layer is more preferably formed with a thickness of 50 Å or more and 60 Å or less in the present invention.

The crystal structure of the seed layer may comprise a perfect crystalline phase, and the orientation of the crystal face in one region of the seed layer may be different from the orientation of the crystal face in another region of the seed layer, by forming the seed layer with a thickness of 50 Å or more. The crystal faces are rotated with each other around the crystal axes perpendicular to the crystal faces, and at least a part of the equivalent crystal axes laying in the crystal face (for example the <001> axis when the crystal face is a {110} face) are oriented in different directions with each other. The crystalline phase has the body-centered cubic structure (bcc structure).

Forming the seed layer with a thickness of 50 Å or more and 60 Å or less as described above permits the rate of change of resistance (ΔR/R) to be 9% or more and the unidirectional exchange bias magnetic field (Hex*) to be about $15.8 \times 10^4$ A/m while enabling the interlayer coupling magnetic field ($H_{in}$) to come extremely close to zero A/m.

The ferromagnetic layer may be formed to have a specular reflection layer in the present invention.

Since lubricity of the surface of the ferromagnetic layer is excellent in the present invention as compared with that in the related art, specular reflectivity of the specular layer formed on the ferromagnetic layer may be improved to enable the rate of change of resistance (ΔR/R) of the magnetic sensing element to be improved.

It is preferable in the present invention that the mean crystal grain diameter of the crystal grains in each layer formed on the seed layer in the direction parallel to the layer face is 200 Å or more. The unidirectional exchange bias magnetic field (Hex*) as well as heat resistance and the rate of change of resistance (ΔR/R) may be improved to the same level as or better than those in the conventional art by forming such large crystal grains.

It is preferable in the present invention that the crystal grain boundaries formed on the cross section of the antiferromagnetic layer exposed by cutting the exchange coupling film in a direction parallel to the direction of thickness is discontinuous to the crystal grain boundaries formed in the ferromagnetic layer at least at a part of the interface between the antiferromagnetic layer and ferromagnetic layer.

It is also preferable in the present invention that the crystal grain boundaries formed on the cross section of the antiferromagnetic layer exposed by cutting the exchange coupling film in a direction parallel to the direction of thickness is discontinuous to the crystal grain boundaries formed in the seed layer at least at a part of the interface between the antiferromagnetic layer and seed layer.

The crystalline state as described above means that the antiferromagnetic layer has transferred from the disordered lattice (face-centered cubic lattice) to the ordered lattice (face-centered orthogonal lattice) by a heat treatment, and the interlayer coupling magnetic field generated between the antiferromagnetic layer and ferromagnetic layer increases by this phase transition.

It is preferable in the present invention that twin crystals are formed at least at a part of the antiferromagnetic layer, and twin crystal boundaries are formed to be non-parallel to interface between the antiferromagnetic layer and ferromagnetic layer in at least a part of the twin crystal.

The atoms in the antiferromagnetic layer are not constrained to the crystal structure of the ferromagnetic layer when the twin crystal boundaries have appeared after the heat treatment of the deposited exchange coupling film. While the antiferromagnetic layer is readily transferred from the disordered lattice (face-centered cubic lattice) to the ordered lattice (face-centered orthogonal lattice) by the heat treatment due to weakened constraint force at the interface, the crystal lattice cannot be effectively transformed unless lattice distortion caused by this transformation is properly relaxed. The atoms in the antiferromagnetic layer are rearranged from the disordered lattice to the ordered lattice by phase transition, and crystal lattice distortion caused thereby is relaxed by changing the atomic arrangement to a mirror symmetry within a short distance. The boundary of the mirror symmetry transformation serves as a twin crystal boundary after the heat treatment, and forming such a twin crystal boundary means an ordered transformation arising by the heat treatment.

The twin crystal boundary is formed in the vicinity of the interface between the antiferromagnetic layer and ferromagnetic layer in the direction to intersect the interface, in order to relax lattice distortion generated by rearrangement of the atoms in the direction parallel to the interface. Consequently, the twin crystal boundaries are formed to be non-parallel to the interface when the atoms totally perform proper ordering transformation. In other words, a very large exchange coupling magnetic field may be obtained by forming the twin crystal boundary to be non-parallel to the interface between the antiferromagnetic layer and ferromagnetic layer.

While both discontinuity of the crystal grain boundaries and non-parallel relation of the twin crystal boundaries are caused by improving wettability of the surface of the seed layer, the composition ratio of the antiferromagnetic layer should be properly controlled in addition to the conditions described above.

It is preferable in the present invention that the antiferromagnetic layer is formed of an antiferromagnetic material comprising an element X (X denotes one or plural elements of Pt, Pd, Ir, Rh, Ru and Os) and Mn.

Alternatively, the antiferromagnetic layer may comprise a X—Mn—X' alloy (the element X' denotes one or plural elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pt and rare earth elements) in the present invention.

The X—Mn—X' alloy is an invasion type solid solution in which the element X' invades in the interstices of a space lattice formed by the element X and Mn. Or, the X—Mn—X' alloy may be a substitution type solid solution in which a part of the lattice points formed of the element X and Mn are substituted with the element X'.

The composition ratio of the element X or the elements X+X' is preferably in the range of 45 at % or more and 60 at % or less in the present invention.

The present invention also provides a magnetic sensing element comprising a seed layer, an antiferromagnetic layer, a pinned magnetic layer, a nonmagnetic layer and a free magnetic layer sequentially laminated from the bottom to the top, and the magnetization direction of the free magnetic layer is aligned in a direction intersecting the magnetization of the pinned magnetic layer. The seed layer, antiferromagnetic layer and pinned magnetic layer are formed of the exchange coupling film as hitherto described.

The present invention also provides a magnetic sensing element comprising a seed layer, an antiferromagnetic exchange bias layer, a free magnetic layer, a nonmagnetic layer, a pinned magnetic layer, and an antiferromagnetic layer sequentially laminated from the bottom to the top. The magnetization direction of the free magnetic layer is aligned in a direction intersecting the magnetization of the pinned magnetic layer, and the seed layer, exchange bias layer and free magnetic layer are formed of the exchange coupling film as hitherto described.

The present invention also provides a magnetic sensing element comprising nonmagnetic layers laminated on and under the free magnetic layer, respectively, pinned magnetic layers formed on one of the nonmagnetic layer and under the other nonmagnetic layer, respectively, and antiferromagnetic layers formed on one of the pinned magnetic layer and under the other pinned layer, respectively, and a seed layer is formed under the antiferromagnetic layer formed below the free magnetic layer. Magnetization direction of the free magnetic layer is aligned in a direction intersecting the magnetization of the pinned magnetic layer and the seed layer. The seed layer, and the antiferromagnetic layer and pinned magnetic layer bonded on the seed layer are formed of the exchange coupling film as hitherto described.

The present invention also provides a magnetic sensing element comprising a seed layer, an antiferromagnetic exchange bias layer, a magnetoresistive layer, a nonmagnetic layer and a soft magnetic layer sequentially laminated from the bottom to the top. The seed layer, exchange bias layer and magnetoresistive layer are formed of the exchange coupling film as hitherto described.

Wettability of the surface of the seed layer may be markedly improved, and the crystal grains in each layer formed on the seed layer may be made to be larger than those in the seed layer formed using the NiFeCr alloy by using the exchange coupling film for the magnetic sensing element as described above. Consequently, the unidirectional exchange bias magnetic field (Hex*) in the pinned magnetic field may be increased over that in the related art, thereby enabling lubricity of each layer on the seed layer to be improved.

Accordingly, electromigration resistance may be improved in high density recording in the future while maintaining the rate of change of resistance ($\Delta R/R$) to the same as or larger than the level as that in the related art in the present invention. The same level of heat resistance may be also obtained.

The ferromagnetic coupling magnetic field (the interlayer coupling magnetic field ($H_{in}$)) by a static magnetic coupling (topological coupling) may be also reduced to reduce asymmetry of the regenerative waveform, thereby enabling regenerative characteristics to be improved.

It is also preferable in the present invention to form an additional specular reflection layer at the side opposed to the nonmagnetic layer in contact with the free magnetic layer. Since lubricity of the surface of the specular reflection layer formed as described above is improved, the rate of change of resistance may be improved by a spectilar effect by improving specular reflectivity of the specular reflection layer.

DESCRIPTION OF THE PREFERRED EMBODIMENT

Figure 1:
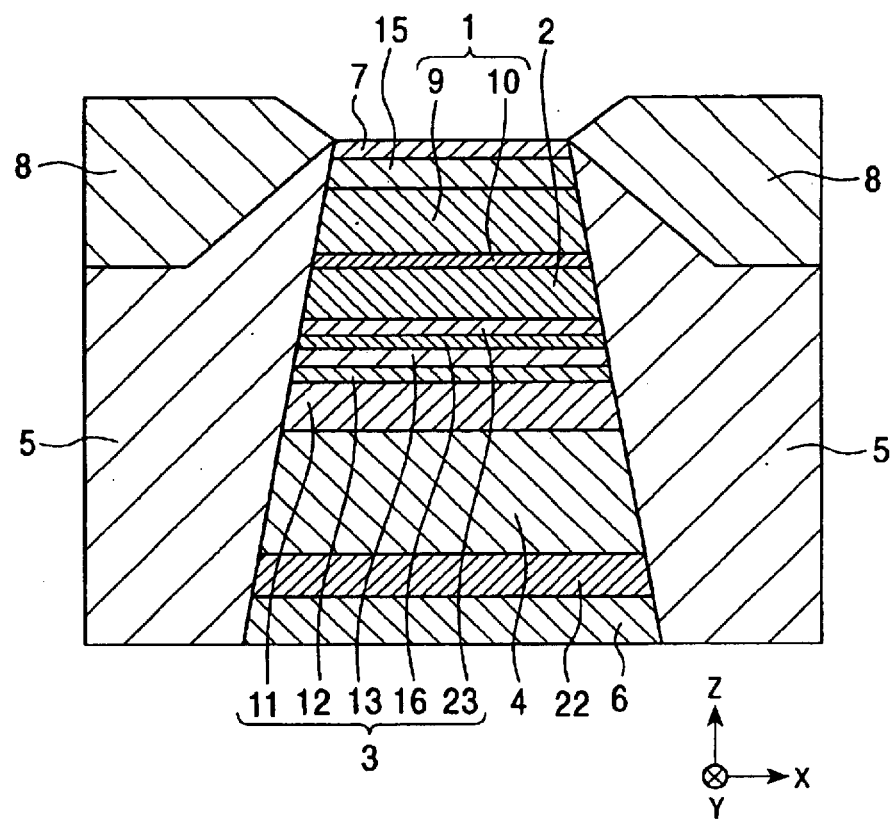
FIG. 1 is a cross section of the structure of the magnetic sensing element (single spin-valve type magnetoresistive element) in a first embodiment of the present invention viewed from an opposed face side to a recording medium.

FIG. 1 is a cross section of the structure of the magnetic sensing element (single spin-valve type magnetoresistive element) in a first embodiment of the present invention viewed from an opposed face side to a recording medium. Only the cross section of the central portion of the element elongating in the X-direction is shown in FIG. 1.

The single spin-valve type magnetoresistive element is provided at the end of a trailing side of a floating type slider attached in a hard disk device to sense a recording magnetic field on the hard disk. The travel direction of a magnetic recording device such as the hard disk is in the Z-direction, and the direction of a leak magnetic field from the magnetic recording medium is in the Y-direction.

An underlayer 6 comprising a nonmagnetic material such as one or plural elements of Ta, Hf, Nb, Zr, Ti, Mo and W is formed at the lowermost part in FIG. 1. A seed layer 22, an antiferromagnetic layer 4, a pinned magnetic layer 3, a nonmagnetic layer 2 and a free magnetic layer 1 are laminated on the seed layer 6.

The antiferromagnetic layer 4 is preferably formed of an antiferromagnetic material comprising an element X (X denotes one or plural elements of Pt, Pd, Ir, Rh, Ru and Os) and Mn on the seed layer 22.

The X—Mn alloy using these platinum group elements has excellent characteristics as the antiferromagnetic material such as an excellent in corrosion resistance, a high blocking temperature and an ability for increasing an exchange coupling magnetic field (Hex). It is particularly preferable to use Pt among the platinum group elements, and a binary alloy such as a PtMn alloy may be used.

The antiferromagnetic layer 4 may be formed with an antiferromagnetic material comprising an element X, element X' (the element X' denotes one or plural elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pt and rare earth elements) and Mn.

It is preferable to use an element that forms an invasion type solid solution by invading in interstices of a space lattice comprising the element X and Mn, or an element that forms a substitution type element by substituting a part of the lattice point of a crystal lattice comprising the element X and Mn, for the element X'. The solid solution as used herein refers to as a solid in which the components are uniformly mixed over a wide range.

Forming the invasion type or substitution type solid solution permits the lattice constant of the X—Mn—X' alloy to be larger than the lattice constant of the X—Mn alloy. Accordingly, the difference of the lattice constant between the antiferromagnetic layer 4 and pinned magnetic layer 3 may be expanded to allow the interface structure between the antiferromagnetic layer 4 and pinned magnetic layer 3 to be readily put in a non-coherent state. The non-coherent state as used herein means a state in which the atoms constituting the antiferromagnetic layer 4 do not correspond to the atoms constituting the pinned magnetic layer 3 in a 1:1 relation at the interface between the antiferromagnetic layer 4 and pinned magnetic layer 3.

When the element X' that forms the substitution type solid solution is used, too large a composition ratio of the element X' makes the antiferromagnetic layer have decreased antiferromagnetic characteristics, thereby reducing the exchange coupling magnetic field generated at the interface on the pinned magnetic layer 3. It is particularly preferable in the present invention to use a rare gas element (one or plural elements of Ne, Ar, Kr and Xe) as an inert gas as the element X'. Since the rare gas element is inert, the antiferromagnetic characteristics are not so largely affected by adding the rare gas element in the layer. Moreover, since Ar has been introduced in a sputtering apparatus as a sputtering gas, Ar may readily invade in the layer merely by properly adjusting the gas pressure.

Although the element X' cannot be hardly incorporated in the layer when a gaseous element is used for the element X', the exchange coupling magnetic field generated by the heat treatment can be markedly increased merely by allowing a minute amount of the element to invade in the layer when the rare gas is used.

The composition range of the element X' is preferably 0.2 to 10 at %, more preferably 0.5 to 5 at % in the present invention. The element X is preferably Pt, and the Pt—Mn—X' alloy is used in the present invention.

The element X or elements X+X' in the antiferromagnetic layer 4 is preferably determined to be 45 at % or more and 60 at % or less, more preferably 49 at % to 56.5 at %, in the present invention. The composition ratio above permits the non-coherent state to be attained at the interface on the pinned magnetic layer 3 in the film deposition process. The antiferromagnetic layer 4 is supposed to perform a proper ordering transformation by applying the heat treatment.

The pinned magnetic layer 3 formed on the antiferromagnetic layer 4 comprises a five-layered structure.

The pinned magnetic layer 3 comprises a magnetic layer 11, an intermediate layer 12, a magnetic layer 13, a specular reflection layer 16 and a magnetic layer 23. The direction of magnetization of the magnetic layers 11, 13 and 23 are put into an antiparallel state with each other by an exchange coupling magnetic field at the interface on the antiferromagnetic layer 4 and by an antiferromagnetic exchange coupling magnetic field (RKKY mutual interaction) with intervention of the intermediate layer 12. This antiparallel state is called as an artificial ferrimagnetic coupling state, which permits magnetization of the pinned magnetic layer 3 to be stabilized while apparently increasing the exchange coupling magnetic field generated at the interface between the pinned magnetic field and antiferromagnetic layer 4. The magnetic layer 13 is magnetized in the same direction as the magnetic layer 23.

A specular reflection layer 16 is formed between the magnetic layers 13 and 23 in this embodiment. Providing the specular reflection layer 16 permits up-spin conduction electrons of the conduction electrons moving in the nonmagnetic layer 2 by flowing a sense current to be reflected at the boundary between the specular reflection layer 16 and magnetic layer 23 while maintaining the spin direction. Consequently, the mean free path of the up-spin conduction electrons may be expanded to enable the difference between the mean free paths of the up-spin conduction electrons and down-spin conduction electrons to be increased, thereby enhancing the rate of change of resistance ($\Delta R/R$).

The surface of the magnetic layer 13 is oxidized after forming the magnetic layer 13, and the oxidized surface thereof serves as the specular reflection layer 16. For example, the magnetic layer 13 is formed of a CoFe alloy, and the surface thereof is oxidized to form the specular reflection layer 16 comprising Co—Fe—O on the surface of the magnetic layer 13. It is also preferable in the present invention to form the magnetic layers 11 and 23 with the CoFe alloy, or the magnetic layers 11, 13 and 23 may be formed with a NiFe alloy or CoFeNi alloy or Co.

In another embodiment, the specular reflection layer 16 comprising a FeMO alloy (the element M denotes at least one of Mn, Co, Ni, Ba, Sr, Y, Gd, Cu and Zn) is deposited by sputtering on the magnetic layer 13, or without forming the magnetic layer 13, followed by forming the magnetic layer 23 thereon.

While it is preferable to form the pinned magnetic layer 3 having the mirror reflection layer, the mirror reflection layer may be omitted from the pinned magnetic layer 3.

While FIG. 1 shows a laminated ferrimagnetic structure of the pinned magnetic layer 3, this layer may be a monolayer or a multilayer of the magnetic material.

For example, the magnetic layer 11 has a thickness of about 12 to 20 Å, the intermediate layer 12 has a thickness of about 8 Å, and the magnetic layer 13 has a thickness of about 5 to 20 Å.

The intermediate layer 12 comprises a nonmagnetic conductive material such as Ru, Rh, Ir, Cr, Re or Cu.

The nonmagnetic layer 2 formed on the pinned magnetic layer 3 is formed of, for example, Cu. The layer is formed of, for example, an insulation material such as $Al_2O_3$ when the magnetic sensing element according to the present invention is a tunnel type magnetoresistive element (AMR element) taking advantage of a principle of the tunnel effect.

A free magnetic layer 1 comprising two layers is formed on the magnetic layer 2.

The free magnetic layer 1 comprises, for example, two layers of a NiFe alloy layer 9 and CoFe alloy layer 10.

Forming the CoFe alloy layer 10 so as to contact the nonmagnetic layer 2 as shown in FIG. 1 permits metal elements to be prevented from diffusing at the interface on the nonmagnetic layer 2, enabling the rate of change of resistance ($\Delta R/R$) to be increased.

The NiFe alloy layer 9 comprises, for example, 80 at % of Ni and 20 at % of Fe. The CoFe alloy layer 10 comprises, for example, 90 at % of Co and 10 at % of Fe. The NiFe alloy layer 9 has a thickness of about 45 Å, while the CoFe alloy layer 10 has a thickness of about 5 Å. Co or a CoFeNi alloy may be used in place of the CoFe alloy layer 10. The free magnetic layer 1 may comprise a monolayer or multilayer structure of a magnetic material, and preferably comprises a monolayer structure of the CoFeNi alloy. The free magnetic layer 1 may comprise a laminated ferrimagnetic structure as in the pinned magnetic layer 3.

A backed layer 15 comprising a metallic material or nonmagnetic metal such as Cu, Au and Ag is formed on the free magnetic layer 1. The backed layer has a thickness of, for example, 20 Å.

A protective layer 7 is formed on the backed layer 15. The protective layer 7 is preferably a specular reflection layer comprising an oxide such as Ta oxide.

Forming the backed layer 15 allows the so-called mean free path of the up-spin conduction electrons that contribute to the magnetoresistive effect to be expanded, and a large rate of change of resistance ($\Delta R/R$) is obtained in the spin-valve type magnetic element by a so-called spin-filter effect, thereby enabling the magnetic element to comply with high density recording. The backed layer 15 may be omitted.

The up-spin conduction electrons encounters mirror reflection at the mirror reflection layer 7 by providing the mirror reflection layer 7 on the backed layer 15, thereby enabling the mean free path of the conduction electrons to be elongated to enable the rate of change of resistance ($\Delta R/R$) to be further improved.

Oxides such as $\alpha\text{-}Fe_2O_3$, Fe—O, Ni—O, Co—O, Co—Fe—O, Co—Fe—Ni—O, Al—O, Al—Q—O (Q denotes at least one element selected from B, Si, N, Ti, V, Cr, Mn, Fe, Co and Ni) and R—O (R denotes at least one element selected from Ti, V, Cr, Zr, Nb, Mo, Hf and W), nitrides such as Al—N, AlQ—N (Q denotes at least one element selected from B, Si, N, Ti, V, Cr, Mn, Fe, Co and Ni) and R—N (R denotes at least one element selected from Ti, V, Cr, Zr, Nb, Mo, Hf and W), and semi-metallic whistler metals such as NiMnSb and PtMnSb may be selected in addition to Ta oxide as the specular reflection layer 7. These materials may be also used for the specular layer 16 formed on the pinned magnetic layer 3.

The hard bias layers 5 and electrode layers 8 are formed at both sides of the laminated layers from the underlayer 6 to the protective layer (specular reflection layer) 7. Magnetization of the free magnetic layer 1 is aligned in the track width direction (X-direction) by a vertical bias magnetic field from the hard bias layer 5.

The hard bias layers 5 are formed of, for example, a Co—Pt (cobalt-platinum) or CoCrPt (cobalt-chromium-platinum) alloy, while the electrode layers are formed of $\alpha$-Ta, Au, Cr, Cu, Rh, Ir, Ru and W. The electrode layers 8 are formed over the free magnetic layer 1 and below the antiferromagnetic layer 4, respectively, in the tunnel type magnetoresistive element and CPP type magnetic sensing element.

A heat treatment is applied after laminating the layers from the underlayer 6 to the protective layer 7 in the spin-valve type thin film element shown in FIG. 1, thereby generating an exchange coupling magnetic field at the interface between the antiferromagnetic layer 4 and pinned magnetic layer 3. Magnetization of the pinned magnetic layer 3 is fixed by being oriented in a direction parallel to the Y-direction by allowing the magnetic field to be applied in the Y-direction. Since the pinned magnetic layer 3 has a laminated ferrimagnetic structure in the embodiment shown in FIG. 1, the magnetic layers 13 and 23 are magnetized in an opposed direction to the Y-direction, when the magnetic layer 1 is magnetized, for example, in the Y-direction.

While the seed layer 22 is formed under the antiferromagnetic layer 4 in the embodiment shown in FIG. 1, the seed layer 22 is formed of Cr in the present invention.

In addition, the seed layer comprises at least a crystalline phase, and the crystal face in at least one region of the seed layer 22 is oriented in a different direction from the direction of the crystal face in another region of the seed layer. For example, the crystal face of a crystal grain on the surface of the seed layer is oriented in a different direction from the direction of another crystal grain on the surface of the seed layer.

The seed layer 22 according to the present invention comprises Cr. Therefore, the surface energy of the surface of the seed layer is increased to put the surface in an active state as compared with the seed layer 22 comprising the NiFeCr alloy, thereby enabling the so-called wettability to be markedly improved.

Improving wettability of the surface of the seed layer 22 makes the antiferromagnetic layer 4 formed on the seed layer 22 to be ready for lamellar growth, and the crystal grain diameter in each layer formed on the seed layer to be larger than that in the related art.

Improvement of wettability as described above seems to be partly caused by different orientations among the crystal faces, or by different orientations of the crystals in different regions.

Furthermore, crystal orientation in the direction parallel to the surface of the seed layer 22 is weakened in the crystal orientation state as described above. Consequently, the atoms constituting the antiferromagnetic layer 4 are hardly affected by crystal orientation on the surface of the seed layer 22 during the film deposition process of the antiferromagnetic layer 4 on the seed layer, making the antiferromagnetic layer to be ready for uniform deposition on the seed layer 22. In addition, wettability of seed layer 22 is quite excellent, the atoms scattered on the surface of the seed layer 22 can more freely move on the seed layer 22, thereby allowing the atoms to be effectively and uniformly deposited on the seed layer 22.

Since crystal orientation in the direction parallel to the direction of the surface of the seed layer 22 is weakened in the present invention as described above, it can be conjectured that no large crystal grains are found on the seed layer 22 as compared with the seed layer comprising the NiFeCr alloy.

Growth of grain boundary steps on the antiferromagnetic layer 4 deposited on the seed layer 22 is accelerated by a shadow effect caused by inclined irradiation of film deposition particles at the grain boundaries formed, when the seed layer 22 contains large crystal grains, to increase undulation on the surface of the antiferromagnetic layer 4. However, since no large crystal grains are found in the seed layer 22 due to weak crystal grain orientation, the grain boundary steps are hardly formed at the crystal grain boundaries in the antiferromagnetic layer 4.

Consequently, undulations are hardly generated on the surface of the antiferromagnetic layer 4 formed on the seed layer 22, enabling lubricity of the surface of the antiferromagnetic layer 4 to be properly improved.

The seed layer 22 is formed of Cr and comprises at least a crystalline phase in the present invention. Moreover, since at least the direction of the crystal face in one region of the seed layer is different from the direction of the crystal face in another region of the seed layer, wettability of the surface of the seed layer can be markedly improved to enable lubricity of the layer on the seed layer 22 to be improved.

The unidirectional exchange bias magnetic field (Hex*) in the pinned magnetic layer 3 may be increased in the present invention by improving wettability. The unidirectional exchange bias magnetic field (Hex*) as used herein is defined to be the magnitude of the exchange bias magnetic field (Hex*) when the rate of change of resistance ($\Delta R/R$) decreases to half of its maximum value.

Since the pinned magnetic layer has the laminated ferrimagnetic structure, the coupling magnetic field in the RKKY mutual exchange coupling generated, for example, between the CoFe alloys constituting the pinned magnetic field 3 is included in the unidirectional exchange bias magnetic field (Hex*), in addition to the exchange coupling magnetic field generated between the pinned magnetic layer 3 and antiferromagnetic layer 4.

The unidirectional exchange bias magnetic field (Hex*) principally means an exchange coupling magnetic field generated between the pinned magnetic field 3 and antiferromagnetic layer 4 when the pinned magnetic field 3 does not have the laminated ferrimagnetic structure. On the other hand, the unidirectional exchange bias magnetic field (Hex*) principally means a magnetic field as a combination of the exchange coupling magnetic field above and the coupling magnetic field in the RKKY mutual exchange coupling when the pinned magnetic layer 3 has the laminated ferrimagnetic structure shown in FIG. 1.

The larger the unidirectional exchange bias magnetic field (Hex*) is, the more properly pinned the pinned magnetic layer 3 in a given direction, and magnetization of the pinned magnetic layer 3 remains to be tightly fixed in a given direction even in a high temperature environment while enabling electromigration to be suppressed, thereby enabling so-called electromigration resistance to be properly improved.

The unidirectional exchange bias magnetic field may be increased due to an increased blocking temperature as a result of increasing the crystal grain diameter in the direction parallel to the surface of each layer formed on the seed layer 22 due to quite good wettability of the surface of the seed layer 22, or by enabling magnetic anisotropy of the crystals $K_{AF}$ of the antiferromagnetic layer 4 to be large.

Since the crystal grain diameter in the direction parallel to the surface of each layer is made larger than in the related art, the same level as or larger than the rate of change of resistance ($\Delta R/R$) in the related art may be may be obtained.

Improving lubricity of the surface of each layer formed on the seed layer 22 in the present invention permits the ferromagnetic coupling magnetic field (interlayer coupling magnetic field, $H_{in}$) by static magnetic coupling (topological coupling) between the pinned magnetic layer 3 and free magnetic layer 1 through intervention of the nonmagnetic layer 2 to be reduced, thereby enabling asymmetry of the regenerative waveform to be reduced and regenerative characteristics to be improved. According to the experiments to be described hereinafter, the interlayer coupling magnetic field ($H_{in}$) may come close to zero A/m.

Since lubricity of the surface of each specular reflection layers 16 or 7 itself is improved by improving lubricity of the surface of each layer on the seed layer 22 when the specular reflection layers 16 and 7 are provided as shown in FIG. 1, specular reflectivity of each specular reflection layers 16 or 7 is improved. Therefore, the rate of change of resistance (ΔR/R) is properly improved by providing the specular reflection layer.

The thickness of seed layer 22 according to the present invention will be described hereinafter. The seed layer 22 is preferably formed with a thickness of 15 Å or more and 60 Å or less when the underlayer 6 comprising at least one element of Ta, Hf, Nb, Zr, Ti, Mo and W is formed under the seed layer 22.

Since the seed layer cannot be densely grown with a uniform thickness when the thickness of the seed layer 22 is smaller than 15 Å, wettability and planarity of the layer becomes insufficient while weakening the crystal orientation and reducing the mean crystal grain diameter of the antiferromagnetic layer and ferromagnetic layer formed on the seed layer 22. Consequently, the rate of change of resistance (ΔR/R) as well as the unidirectional exchange bias magnetic field (Hex*) become small with an increased interlayer coupling magnetic field ($H_{in}$).

A thickness of the seed layer 22 of larger than 60 Å is also not preferable, since the proportion of shunt of the sense current to the seed layer 22 increases to rapidly decrease the rate of change of resistance (ΔR/R).

A rate of change of resistance (ΔR/R) of 9% or more and a unidirectional exchange bias magnetic field (Hex*) of about $11.85 \times 10^4$ A/M or more may be obtained by adjusting the thickness of the seed layer 22 within the range of 15 Å or more and 60 Å or less. A crystalline phase with a body-centered cubic structure (bcc structure) may be also properly incorporated in the seed layer 22.

More preferably, the seed layer 22 has a thickness in the range of 20 Å or more and 60 Å or less when the underlayer 6 is provided under the seed layer 22. Forming the seed layer 22 with a thickness of 20 Å or more allows a uniform layer to be densely grown to enable wettability to be properly improved.

The rate of change of resistance (ΔR/R) may be adjusted to 9% or more and the unidirectional exchange bias magnetic field (Hex*) may be increased to about $15.8 \times 10^4$ A/m or more by forming the seed layer 22 with a thickness of 20 Å or more and 60 Å or less. The interlayer coupling magnetic field ($H_{in}$) may also come extremely close to zero A/m.

The thickness of the seed layer 22 is preferably in the range of 50 Å or more and 60 Å or less when the underlayer 6 is provided under the seed layer 22.

The crystal structure of the seed layer may be completely composed of the crystalline phase by forming the seed layer 22 with a thickness of 50 Å or more. The direction of the crystal face at least in a region comprising the seed layer may be oriented in a different direction from the direction of the crystal face in another region of the seed layer. In addition, the crystal faces are rotated around a crystal axis perpendicular to the crystal face with each other, and at least a part of the equivalent crystal axes laying in the crystal face (for example the <001> axis when the crystal face is a {110} face) are oriented in different directions with each other. The crystalline phase has the body-centered cubic structure (bcc structure).

The experiment to be described hereinafter shows that the interlayer coupling magnetic field ($H_{in}$) generated between the pinned magnetic layer 3 and free magnetic layer 1 may come close to zero A/m by forming the seed layer 22 with a thickness of 50 Å or more. Consequently, crystals may be properly oriented by forming the seed layer 22 with a thickness of 50 Å or more, thereby enabling lubricity of each layer formed on the seed layer to be properly improved.

Forming the seed layer 22 with a thickness of 50 Å or more and 60 Å or less permits the rate of change of resistance (ΔR/R) to be 9% or more and the unidirectional exchange bias magnetic field (Hex*) to be about $15.8 \times 10^4$ A/m or more while enabling the interlayer coupling magnetic field ($H_{in}$) to come extremely close to zero A/m.

The seed layer 22 is preferably formed with a thickness of 25 Å or more and 60 Å or less, when the underlayer 6 comprising at least one element of Ta, Hf, Nb, Zr, Ti, Mo and W is not formed under the seed layer 22.

Wettability as well as planarity of the surface of the seed layer 22 becomes worse when the seed layer 22 has a thickness of 25 Å or less, because the seed layer 22 is not densely grown with a uniform thickness. Accordingly, crystal orientation of each layer of the antiferromagnetic layer and ferromagnetic layer formed on the seed layer 22 as well as the mean crystal grain diameter are reduced with decreased rate of change of resistance (ΔR/R) and unidirectional exchange bias magnetic field (Hex*), thereby increasing the interlayer coupling magnetic field ($H_{in}$).

The seed layer 22 is formed with a thickness of 25 Å or more and 60 Å or less when underlayer 6 is provided under the seed layer 22, which makes it possible to adjust the rate of change of resistance (ΔR/R) to 9% or more and the unidirectional exchange bias magnetic field (Hex*) to about $11.85 \times 10^4$ A/m while allowing a crystalline phase to be incorporated in the layer structure. The crystalline phase has, for example, a body-centered cubic structure.

More preferably, the seed layer 22 is formed with a thickness of 30 Å or more and 60 Å or less when no underlayer 6 is provided under the seed layer 22. Forming the seed layer 22 with a thickness of 30 Å or more allows the layer to be densely grown with uniform thickness, thereby enabling wettability to be properly improved.

Forming the seed layer with a thickness of 30 Å or more and 60 Å or less enables the rate of change of resistance (ΔR/R) to be 9% or more while increasing the unidirectional exchange bias magnetic field (Hex*) to about $15.8 \times 10^4$ A/m or more. The interlayer coupling magnetic field ($H_{in}$) may come extremely close to zero A/m.

It is more preferable that the seed layer has a thickness of 50 Å or more and 60 Å or less when the underlayer 6 is formed under the seed layer 22.

The seed layer 22 is completely composed of the crystalline phase by forming the seed layer 22 with a thickness of 50 Å or more. The crystal face in at least a region of the seed layer may be oriented in a different direction from the direction of the crystal face in another region of the seed layer. In addition, the crystal faces are rotated around a crystal axis perpendicular to the crystal face with each other, and at least a part of the equivalent crystal axes laying in the crystal face (for example the <001> axis when the crystal face is a {110} face) are oriented in different directions with each other. The crystalline phase has the body-centered cubic structure (bcc structure).

A rate of change of resistance (ΔR/R) of 9% or more and a unidirectional exchange bias magnetic field (Hex*) of about $15.8 \times 10^4$ A/m may be obtained by forming the seed layer with a thickness of 50 Å more and 60 Å or less. The interlayer coupling magnetic field ($H_{in}$) may also come extremely close to zero A/m.

The underlayer itself has relatively good wettability. Therefore, the Cr atoms constituting the seed layer 22 is more uniformly deposited on the underlayer 6 to properly improve wettability of the surface of the seed layer 22. Consequently, wettability of the seed layer 22 may be properly improved even when the seed layer 22 is as thin as, for example, about 15 Å, thereby enabling the preferable values of the unidirectional exchange bias magnetic field (Hex*) and interlayer coupling magnetic field ($H_{in}$).

However, the effects manifested by providing the underlayer 6 cannot be obtained when no underlayer 6 is provided under the seed layer 22. Consequently, wettability of the surface of the seed layer 22 that has been unevenly deposited becomes not so good when the seed layer 22 is too thin, thereby failing in obtaining a large unidirectional exchange bias magnetic field (Hex*). Therefore, it is effective to form a thick seed layer 22 in order to properly improve wettability of the surface of the seed layer 22 without providing the underlayer 6. According to the experiment to be described hereinafter, forming the seed layer 22 with a thickness of 25 Å or more permits the unidirectional exchange bias magnetic field (Hex*) of about $11.85 \times 10^4$ A/m or more and rate of change of resistance ($\Delta R/R$) of 9% or more t be obtained. Consequently, the preferable thickness of the seed layer 22 is 25 Å or more when no underlayer 6 is provided under the seed layer 22.

Not only setting of the thickness of the layer, nut also the deposition conditions for depositing the seed layer 22 is a crucial factor for obtaining the crystalline state of the seed layer 22 as described above.

It is preferable in the present invention to set the temperature of the substrate for depositing the seed layer 22 by sputtering at 20 to 100° C., the distance between the substrate and target at 40 to 80 mm, and the Ar gas pressure introduced for depositing the layer by sputtering at 0.5 to 3 mTorr (0.067 to 0.4 Pa). Controlling the deposition conditions as described above makes it possible to allow the crystalline phase to be incorporated at least in the seed layer 22. The orientation of the crystal face in at least a region of the seed layer may be different from the orientation of the crystal face in another region of the seed layer. In other words, the orientation of the crystal face in one crystal grain on the surface of the seed layer may be different from the orientation of another crystal grain on the surface of the seed layer.

Crystal orientation of the seed layer 22 will be described in more detail hereinafter. The seed layer 22 contains at least a crystalline phase in the present invention, and the orientation of the crystal face at least in one region of the seed layer is different from the orientation of the crystal face in another region of the seed layer.

The crystal face is represented by an equivalent crystal face [110]. The equivalent crystal faces represented by [110] include (110), (1-10), (-110), (-1-10), (101), (10-1), (-101), (-10-1), (011), (01-1), (0-11) and (0-1-1) faces. These crystal faces indicate the crystal faces (real lattice face, or reciprocal lattice point in the diffraction image) in a single crystal structure represented by Miller indices. Any one of these crystal faces are represented by the [110] face.

An electron microscopic photograph to be described hereinafter indicates that the orientation of the [110] face in a region of the seed layer 22 is different from the orientation of the [110] face in another region of the seed layer.

While a total observation of the [110] face laying in the seed layer 22 indicates that the [110] face is oriented to be nearly parallel to the surface of the layer, the degree of orientation is smaller than the degree of orientation of the [111] face when the NiFeCr alloy is used for the seed layer.

It has been emphasized in the related art to enhance the degree of orientation of the [111] phase in the seed layer formed of the NiFeCr alloy. On the contrary, enhancing the degree of orientation of the [110] face is avoided in the present invention. As a result, the present invention succeeded in obtaining quite high wettability of the seed layer 22 formed of Cr while improving lubricity of each layer formed on the seed layer 22 by a synergetic effect for decreasing the degree of crystal orientation.

Diffraction spots corresponding to the reciprocal lattice points representing equivalent crystal faces are seen in the electron diffraction patterns measured in one area and another area of the seed layer. Shift of the inclined angle of each virtual line from the line normal to the layer surface obtained by connecting each diffraction spot and the origin of the beam is within an angle of zero to 45 degree, and the crystal axes laying in the crystal face, or at least a part of the equivalent crystal axes, are preferably oriented in different directions with each other.

Suppose that the crystal face is the (110) face. The diffraction spots corresponding to the reciprocal lattice points representing the (110) face in the electron beam diffraction pattern are connected to the origin of the beam. The inclination angle of the virtual line, obtained by the operation above, from the direction of the normal line to the layer surface is measured relative to the (110) faces appearing on one region and on another region of the seed layer, for example on one crystal grain and on another crystal grain on the seed layer. Then, the electron microscopic photograph shows that the (110) faces are oriented in an approximately the same direction with each other when the shift of the inclined angle of the virtual line is within an angle of zero to 45 degree. The shift of the angle of the virtual line of zero degree shows perfect alignment of the orientation of each (110) face among the crystal grains.

When the shift of the angle of the virtual line obtained from the measurement of the electron diffraction pattern of each crystal face is within a range of zero to 45 degree, the orientation of each (110) face is considered to be not so largely different, and the antiferromagnetic layer 4 may perform epitaxial growth on the crystal face. It has been conjectured that atoms tends to be in a conformity state with 1:1 correspondence with each other at the interface between the seed layer 22 and antiferromagnetic layer 4 when the antiferromagnetic layer is epitaxially grown. However, the crystal faces are rotated with each other around the crystal axis in the direction perpendicular to the crystal face in the present invention, even when crystal faces in one region and another region of the surface of the seed layer, for example the crystal faces on one crystal grain and another crystal grain on the surface of the seed layer, are oriented approximately in the same direction. Accordingly, at least a part of the equivalent crystal axes (for example the <001> axis when the crystal face is {110} face) laying in the crystal face are oriented in different directions with each other.

The atoms constituting the antiferromagnetic layer 4 formed on the seed layer 22, and the atoms constituting the seed layer 22 are liable to be not in a 1:1 correspondence state, or in a so-called non-coherent state, with each other when the crystal orientation is as described above.

Non-conformity between the seed layer 22 and antiferromagnetic layer 4 at the interface permits the antiferromagnetic layer 4 to transform from the disordered lattice (face-centered cubic lattice) to the ordered lattice (café-centered orthogonal lattice), and a large exchange coupling magnetic field may be obtained between the antiferromagnetic layer 4 and pinned magnetic layer 3.

The mean crystal grain diameter of the crystal grains formed on each layer on the seed layer 22 in the direction parallel to the surface of the layer is preferably 200 Å or more. It is confirmed from the experiment to be described hereinafter that the mean crystal grain diameter of 200 Å or more is obtainable in the example in which the seed layer is formed of Cr.

The crystal grain diameter in the range as described above permits electromigration resistance to be improved to improve current flow reliability, while increasing the rate of change of resistance (ΔR/R) and heat resistance to the same as or larger than those in the related art.

It is preferable in the present invention that the crystal grain boundaries in the antiferromagnetic layer 4 and the crystal grain boundaries in the pinned magnetic layer 3 exposed by cutting the magnetic sensing element parallel to the direction of thickness are discontinuous with each other at least at a part of the interface between the antiferromagnetic layer 4 and pinned magnetic layer 3.

Likewise, it is also preferable in the present invention that the crystal grain boundaries in the antiferromagnetic layer 4 and the crystal grain boundaries in the seed layer 22 exposed by cutting the magnetic sensing element parallel to the direction of thickness are discontinuous with each other at least at a part of the interface between the antiferromagnetic layer 4 and seed layer 22.

It is preferable in the present invention that twin crystals are formed at least at a part of the antiferromagnetic layer 4, and the interface between the twin crystals is formed at least a part of the twin crystals so as to be non-parallel to the interface at the seed layer 22.

The so-called nonconformity is maintained at the interface between the antiferromagnetic layer 4 and pinned magnetic layer 3, and the antiferromagnetic layer 4 properly transforms from the disordered lattice to the ordered lattice by heat treatment, thereby enabling a large exchange coupling magnetic field to be obtained, when the twin crystal is formed as described above.

For obtaining the conditions as described above, high wettability of the surface of the seed layer 22 and crystal orientation of the seed layer 22 are important in the present invention. However, it is also important to properly control the composition ratio of the antiferromagnetic layer 4 and deposition conditions of each layer formed on the seed layer 22.

As hither to described, the composition ratio of the element X or elements X+X' constituting the antiferromagnetic layer 4 is preferably in the range of 45 at % or more and 60 at % or less.

Among the film deposition conditions, the Ar gas pressure used for deposition by sputtering is adjusted to 3 mTorr. The heat treatment temperature for generating an exchange coupling magnetic field between the antiferromagnetic layer 4 and pinned magnetic layer 3 is adjusted to 200° C. or more and 300° C. or less, and the heat treatment is applied in a magnetic field for 2 hours or more in a vacuum of $10^{-6}$ Torr or less. The distance between the substrate and target is adjusted to 80 mm.

Proper nonconformity is provided at the interface between the antiferromagnetic layer 4 and pinned magnetic layer 3, and at the interface between the antiferromagnetic layer 4 and seed layer 22 by controlling the composition ratio and deposition condition of the antiferromagnetic layer 4, enabling an exchange coupling magnetic field of as high as about $15.8 \times 10^4$ A/m or more to be obtained between the antiferromagnetic layer 4 and pinned magnetic layer 3.

With respect to the crystal orientation of each layer formed on the seed layer 22, the crystals of each layer on the seed layer may be predominantly oriented in the [111] direction as in the related art, or the degree of orientation in the [111] direction may be weak in the present invention.

An electron microscopic observation of the crystal orientation on the seed layer showed that the crystal orientation of the seed layer 22 (orientation of the (0-10) face) matches the crystal orientation (orientation of the (111) face) of each layer (pinned magnetic layer 3, nonmagnetic layer 2 and free magnetic layer 1) above the antiferromagnetic layer 4 in the direction of thickness.

The antiferromagnetic layer 4, pinned magnetic layer 3, nonmagnetic layer 2 and free magnetic layer 1 seem to be deposited in accordance with the crystal orientation of the seed layer 22. However, since atomic arrangement is in a non-coherent state at the interface between the seed layer 22 and antiferromagnetic layer 4, and the interface between the antiferromagnetic layer 4 and pinned magnetic layer 3, the antiferromagnetic layer 4 properly transforms from the disordered lattice to the ordered lattice by applying a heat treatment. While the crystal orientation of the antiferromagnetic layer 4 becomes to be different from the crystal orientation of the seed layer 22 due to a change of the crystal orientation of the antiferromagnetic layer 4, the crystal orientation of each layer above the antiferromagnetic layer 4 remains unchanged by the heat treatment. Consequently, the crystal orientation of the seed layer 22 roughly matches the crystal orientation of each layer above the antiferromagnetic layer 4 in the direction of thickness.

The crystal structure of the seed layer 22 is the body-centered cubic structure (bcc structure) in the present invention. Although the face-centered cubic structure (fcc structure) has been emphasized in the related art as the crystal structure of the seed layer 22, wettability of the surface of the seed layer 22 is quite high in the present invention even by forming the body-centered cubic structure as described above, thereby enabling the unidirectional exchange bias magnetic field (Hex*) to be improved over the related art.

The layer structure of the seed layer 22 may be also applied for other magnetic sensing elements.

Figure 2:
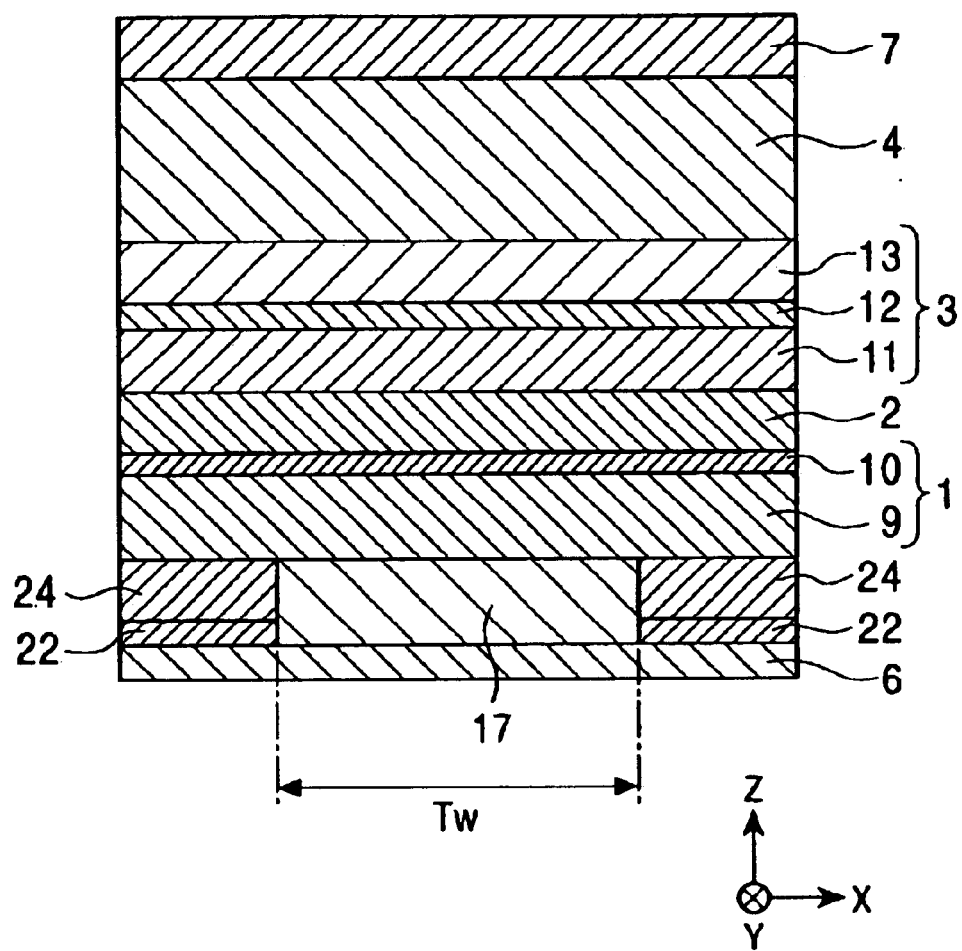
FIG. 2 is a cross section of the structure of the magnetic sensing element (single spin-valve type magnetoresistive element) in a second embodiment of the present invention viewed from an opposed face side to a recording medium.

FIG. 2 and the drawings thereafter denote magnetic sensing elements having different layer structures from that of the magnetic sensing element shown in FIG. 1.

FIG. 2 is a partial cross section of the magnetic sensing element (spin-valve type thin film element) in the present invention viewed from the opposed face side to a recording medium.

In the spin-valve type thin film element shown in FIG. 2, a pair of seed layers 22 are formed on an underlayer 6 with a space corresponding to the track width Tw open in the track width direction (X-direction), and exchange bias layers 24 are formed on the seed layers 22.

The spaces between a pair of the seed layers 22, and between the exchange bias layers 24 are filled with an insulation layer 17 made of an insulation material such as $SiO_2$ and $Al_2O_3$.

A free magnetic layer 1 is formed on the exchange bias layers 24 and insulation layer 17.

The exchange bias layer 24 is formed of a X—Mn or X—Mn—X' alloy. The composition range of the element X or elements X' is preferably 45 at % or more and 60 at % or less, more preferably 49 at % or more and 56.5 at % or less.

Both ends of the free magnetic layer 1 are magnetized as single magnetic domains by an exchange coupling magnetic field between the exchange bias layers 24, and magnetization of the free magnetic layer 1 in the track width region is properly aligned in the X-direction to an extent capable of responding to an external magnetic field.

As shown in FIG. 2, a nonmagnetic layer 2 is formed on the free magnetic layer 1, and a pinned magnetic layer 3 is formed on the nonmagnetic layer 2. An antiferromagnetic layer 4 and a protective layer 7 are additionally formed on the pinned magnetic layer 3.

The seed layer 22 is formed of Cr in this embodiment and contains at least a crystalline phase in the seed layer 22. The orientation of the crystal face in at least a region of the seed layer 22 is different from the orientation of the crystal face in another region of the seed layer. For example, the orientation of the crystal face of a crystal grain on the surface of the seed layer 22 is different from the orientation of the crystal face of another crystal grain on the surface of the seed layer.

The seed layer 22 is formed of Cr with the crystal orientations as described above. Consequently, wettability of the surface of the seed layer 22 may be remarkably enhanced, and the crystal grain diameter in each layer on the seed layer 22 may be increased, thereby enabling lubricity of the surface of each layer formed on the seed layer 22 to be improved while increasing the unidirectional exchange bias magnetic field (Hex*) in the free layer 1.

According to the present invention, electromigration resistance represented by electron migration resistance may be improved while decreasing the ferromagnetic coupling magnetic field (interlayer coupling magnetic field, $H_{in}$) by the static magnetic coupling between the free magnetic layer 1 and pinned magnetic layer 3, thereby decreasing asymmetry of the regenerative wave form.

FIG. 1 should be cited with respect to the thickness of the seed layer 22 and other layers, since they are the same as described in FIG. 1.

Figure 3:
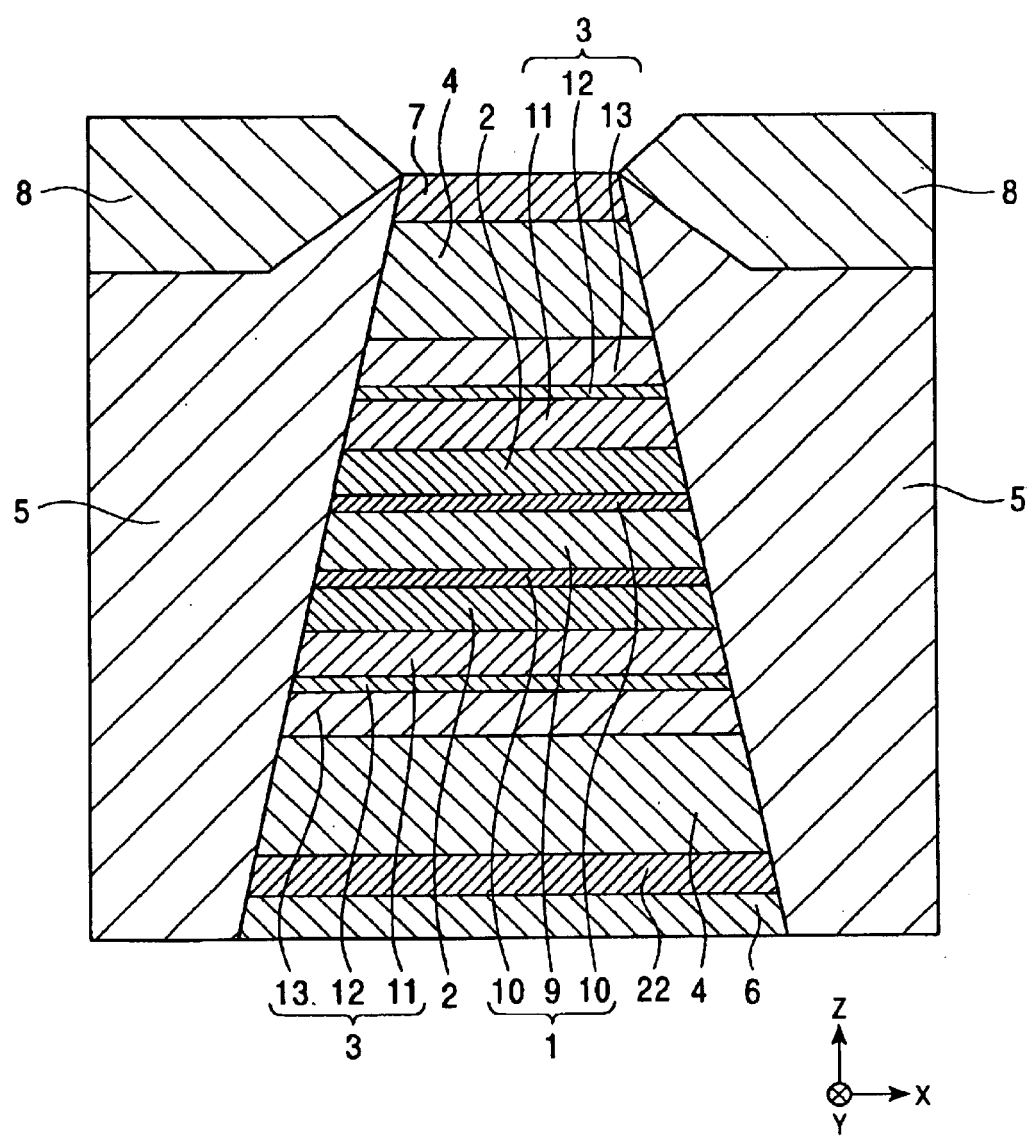
FIG. 3 is a cross section of the structure of the magnetic sensing element (dual spin-valve type magnetoresistive element) in a third embodiment of the present invention viewed from an opposed face side to a recording medium.

FIG. 3 is a partial cross section showing the structure of the dual spin-valve type thin film element according to the present invention.

As shown in FIG. 3, an underlayer 6, a seed layer 22, an antiferromagnetic layer 4, a pinned magnetic layer 3, a nonmagnetic layer 2 and a free magnetic layer 1 are continuously laminated from the bottom to the top. The free magnetic layer 1 comprises three layers, for example two Co layers 10 and a NiFe alloy layer 9. The nonmagnetic layer 2, pinned magnetic layer 3, antiferromagnetic layer 4 and a protective layer 7 are continuously formed on the free magnetic layer 1.

Hard bias layers 5 and electrode layers 8 are formed at both sides of a multilayer from the underlayer 6 to the protective layer 7. Each layer in FIG. 3 is formed of the same material as used in FIG. 1.

The seed layer 22 is formed under the antiferromagnetic layer 4 located below the free magnetic layer 1 in this example. The composition ratio of the element X or elements X+X' comprising the antiferromagnetic layer 4 is preferably 45 at % or more and 60 at % or less, more preferably 49 at % or more and 56.5 at % or less.

The seed layer 22 is also formed of Cr in this embodiment, and the seed layer comprises at least a crystalline phase. The orientation of the crystal face at least in a region on the seed layer 22 is different from the orientation of the crystal face in another region on the seed layer. For example, the orientation of the crystal face on one crystal grain on the surface of the seed layer 22 is different from the orientation of the crystal face on another crystal grain on the surface of the seed layer 22.

Wettability of the surface of the seed layer 22 may be markedly improved by forming the seed layer with Cr with the crystal orientation as described above, thereby enabling the crystal grain diameter in each layer on the seed layer 22 to increase the unidirectional exchange bias magnetic field (Hex*) of the pinned magnetic layer 3. Lubricity of the surface of each layer formed on the seed layer 22 may be also improved, and a rate of change of resistance (ΔR/R) with the same level as or larger than the level in the related art may be obtained.

Accordingly, electron migration resistance represented by electromigration resistance is improved in the present invention, while reducing the ferromagnetic coupling magnetic field (interlayer coupling magnetic field, $H_{in}$) caused by the static magnetic coupling (topological coupling) between the free magnetic laery 1 and pinned magnetic layer 3. Asymmetry of the regenerative waveform of the magnetic head is also reduced, and specular reflectivity of the specular reflection layer may be improved when the specular reflection layer is provided, thereby enabling the rate of change of resistance to be improved.

It is possible in the spin-valve type thin film element in the present invention having the effects as hitherto described to manufacture the spin-valve type thin film element capable of sufficiently complying with high density recording, even when the sense current flowing in the magnetic sensing element increases in high density recording in the future.

FIG. 1 should be cited with respect to the thickness of the seed layer 22 and other layers, since they are the same as described in FIG. 1.

Figure 4:
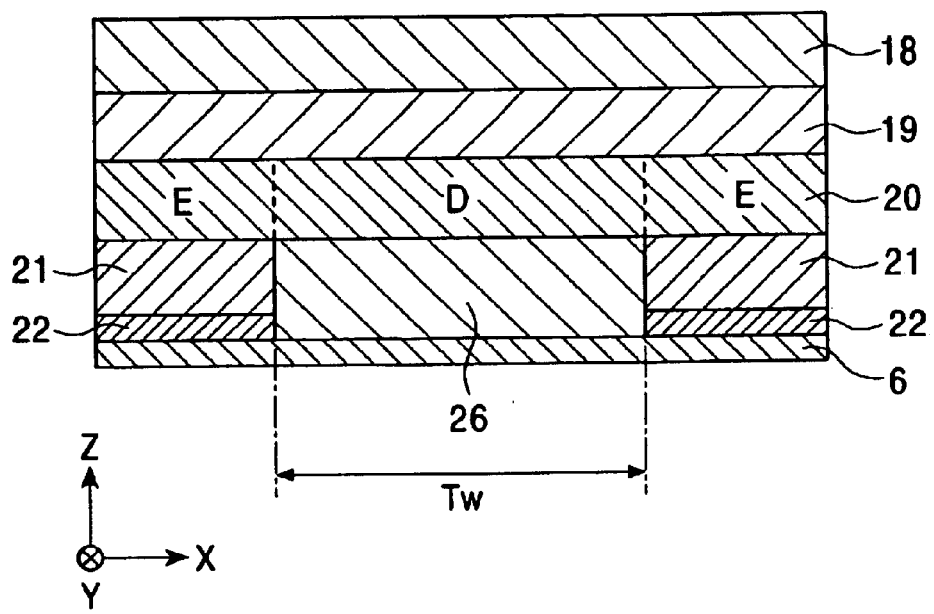
FIG. 4 is a cross section of the structure of the magnetic sensing element (AMR type magnetoresistive element) in a fourth embodiment of the present invention viewed from an opposed face side to a recording medium.

FIG. 4 is a partial cross section of an anisotropic magnetoresistive element (AMR element) according to the present invention cut in the direction parallel to the opposed face side to the recording medium.

In FIG. 4, a pair of seed layers 22 are formed with a distance corresponding to the track width Tw open in the track width direction (X-direction). Exchange bias layers 21 are formed on the seed layers 22, and the spaces between a pair of the seed layers 22 and between the exchange bias layers 21 are filled with an insulation layer 26 formed of an insulation material₂ such as $SiO_2$ and $Al_2O_3$.

A magnetoresistive layer 20 (MR layer), a nonmagnetic layer (SHUNT layer) 19 and a soft magnetic layer (SAL layer) 18 are laminated on the exchange bias layers 21 and insulation layer 16.

The area E of the magnetoresistive layer 20 shown in FIG. 4 is magnetized as a single magnetic domain in the X-direction by an exchange coupling magnetic field generated between each exchange bias layer 21 and magnetoresistive layer 20 in the AMR type thin film element shown in FIG. 4. Magnetization of the area D of the magnetoresistive layer 20 is aligned in the X-direction by being induced by the exchange coupling magnetic field. An electric current magnetic field generated by a sensing current flowing in the magnetoresistive layer 20 is applied to the soft magnetic layer 18 in the Y-direction, and a transverse bias magnetic field is applied in the Y-direction in area D of the magnetoresistive layer 20 by a static magnetic coupling energy given by the soft magnetic layer 18. The change of resistance against the change of the magnetic field in the area D of the magnetoresistive layer 20 (magnetoresistive characteristics: H-R effect characteristics) is made to be linear by applying the transverse bias magnetic field to the area D of the magnetoresistive layer 20 magnetized in the X-direction as a single magnetic domain.

Since the travel direction of the recording medium is in the Z-direction, resistance of the area D of the magnetoresistive layer 20 changes by applying a leak magnetic field in the Y-direction, and the resistance change is sensed as a voltage change.

The seed layer 22 is also formed of Cr in this embodiment with at least a crystalline phase in the seed layer 22. The orientation of the crystal face at least in a region in the seed layer 22 is different from the orientation of the crystal face in another region in the seed layer. For example, the orientation of the crystal face at least on the surface of one crystal grain region in the seed layer 22 is different from the orientation of the crystal face on the surface of another crystal grain in the seed layer.

Wettability of the surface of the seed layer 22 can be enhanced in the present invention as compared with that in the related art by forming the seed layer with Cr with the crystal orientations as described above. Consequently, the crystal grain diameter in each layer on the seed layer 22 may be increased while increasing the unidirectional exchange bias magnetic field (Hex*) in the magnetoresistive layer 20, thereby enabling lubricity of the surface of each layer formed on the seed layer 22.

Accordingly, electric current reliability represented by electromigration resistance may be increased in the present invention, thereby reducing the ferromagnetic coupling magnetic field (interlayer coupling magnetic field, $H_{in}$) generated by a static magnetic coupling (topological coupling) between the magnetoresistive layer 20 and soft magnetic layer 18.

It is possible in the magnetic sensing element in the present invention having the effects as hitherto described to manufacture the AMR type thin film element capable of sufficiently complying with high density recording, even when the sense current flowing in the magnetic sensing element increases in high density recording in the future.

FIG. 1 should be cited with respect to the thickness of the seed layer 22 and other layers, since they are the same as described in FIG. 1.

Figure 5:
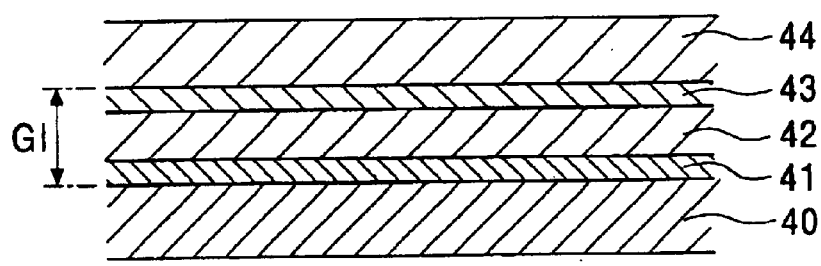
FIG. 5 is a partial cross section of the thin film magnetic head comprising the magnetic sensing element.

FIG. 5 is a cross section of the structure of a read head, in which any one of the magnetic sensing element shown in FIGS. 1 to 4 is formed, viewed from the opposed face side of the recording medium.

The reference numeral 40 denote a lower shield layer formed of, for example, a NiFe alloy, and a lower gap layer 41 is formed on the lower shield layer 40. The magnetic sensing element 42 shown in any one of FIGS. 1 to 4 is formed on the lower gap layer 41, an upper gap layer 43 is formed on the magnetic sensing element 42, and an upper shield layer 44 formed of a NiFe alloy is formed on the upper gap layer 43.

The lower gap layer 41 and upper gap layer 43 are formed, for example, of an insulation material such as $SiO_2$ and $Al_2O_3$ (alumina). As shown in FIG. 5, the length from the lower gap layer 41 to the upper gap layer 43 corresponds to the gap length G1. The smaller the gap length G1 is, the better the element can comply with high density recording.

A large exchange coupling magnetic field may be generated in the present invention even when the thickness of the antiferromagnetic layer 4 is small. The antiferromagnetic layer 4 is formed with a thickness of, for example, 70 Å or more, which is a sufficiently small thickness of the antiferromagnetic layer 4 as compared with about 300 Å in the conventional antiferromagnetic layer. Accordingly, a thin film magnetic head capable of complying with high density recording may be manufactured by narrowing the gap.

A write inductive head may be formed on the upper shield layer 44.

The magnetic sensing element according to the present invention can be also used for a magnetic sensor other than that integrated in the hard disk device.

The method for manufacturing the magnetic sensing element according to the present invention will be described hereinafter.

The seed layer 22 is deposited on the underlayer 6 by sputtering in the first step of the present invention. The underlayer 6 is preferably formed of at least one element of Ta, Hf, Nb, Zr, Ti, Mo and W. Forming the underlayer 6 permits the seed layer 22 to be formed as a dense layer on the seed layer, enabling wettability of the seed layer 22 to be properly improved.

A target made of Cr is used for depositing the seed layer 22 by sputtering.

It is preferable for depositing the seed layer 22 by sputtering that the deposition temperature of the substrate 25 is controlled at 20 to 100° C., the distance between the substrate 25 and target is adjusted to 40 to 80 mm, and the Ar gas pressure introduced for sputtering is adjusted at 0.5 to 3 mTorr (0.067 to 0.4 Pa).

The seed layer 22 is formed with a thickness of 15 Å or more and 60 Å or less in the present invention. The thickness and deposition conditions as described above permit the orientation of the crystal face in one region of the seed layer 22 to be different from the orientation of the crystal face in another region formed on the seed layer 22. For example, the orientation of the crystal face on one crystal grain on the surface of the seed layer 22 may be different from the orientation of the crystal face on another crystal grain on the surface of the seed layer 22.

The layer cannot be densely grown with a uniform thickness when the seed layer 22 has a thickness of 15 Å or less. Consequently, wettability as well as planarity of the seed layer becomes so insufficient that crystal orientations of the antiferromagnetic layer and ferromagnetic layer laminated on the seed layer as well as the mean crystal grain diameter are reduced while decreasing the unidirectional exchange bias magnetic field (Hex*) and increasing the interlayer coupling magnetic field ($H_{in}$).

The proportion of shunt of the sense current to the seed layer 22 increases when the seed layer 22 has a thickness of 60 Å or more, thereby arising an undesirable rapid decrease of the rate of change of resistance ($\Delta R/R$).

A rate of change of resistance ($\Delta R/R$) of 9% or more and a unidirectional exchange bias magnetic field (Hex*) of about $11.85 \times 10^4$ A/m may be obtained by adjusting the thickness of the seed layer in the range of 15 Å or more and 60 Å or less. A crystalline phase having the body-centered cubic structure (bcc structure) may be properly incorporated in the seed layer 22.

The thickness of the seed layer 22 is preferably in the range of 20 Å or more and 60 Å or less when the underlayer 6 is formed under the seed layer 22. Forming the seed layer 22 with a thickness of 20 Å or more permit a uniform and dense layer to be grown while properly improving wettability.

A rate of change of resistance (ΔR/R) of 9% or more as well as a unidirectional exchange bias magnetic field (Hex*) of about $15.8 \times 10^4$ A/m may be obtained by forming the seed layer 22 with a thickness of 20 Å or more and 60 Å or less. The interlayer coupling magnetic field ($H_{in}$) may also come extremely close to zero.

More preferably, the seed layer 22 is formed with a thickness of 50 Å or more and 60 Å or less, when the underlayer 6 is provided under the seed layer 22.

Forming the seed layer with a thickness of 50 Å or more permits the seed layer to perfectly comprise the crystalline phase, and the orientation of the crystal face in one region in the seed layer may be different from the orientation of the crystal face in another region in the seed layer. The crystal face having a different orientation is rotated around a crystal axis perpendicular to the crystal face, and at least a part of the equivalent crystal axes (for example the <001> axis when the crystal face is {110} face) laying in the crystal face are oriented in different directions with each other.

A rate of change of resistance (ΔR/R) of 9% or more and a unidirectional exchange bias magnetic field (Hex*) of about $15.8 \times 10^4$ A/m may be obtained by forming the seed layer with a thickness of 50 Å or more and 60 Å or less, while enabling the interlayer coupling magnetic field ($H_{in}$) to be come extremely close to zero A/m.

Then, the antiferromagnetic layer 4 is formed by sputtering on the seed layer 22.

It is preferable in the present invention to deposit the antiferromagnetic layer 4 by sputtering using an antiferromagnetic material comprising the element X (X denotes one or plural elements of Pt, Pd, Ir, Rh, Ru and Os).

Alternatively, the antiferromagnetic layer 4 may be deposited by sputtering using the X—Mn—X' alloy (the element X' denotes one or plural elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pt and rare earth elements).

It is preferable in the present invention that the composition ratio of the element X or elements X+X' is 45 at % or more and 60 at % or less.

Subsequently, the pinned magnetic layer 3, nonmagnetic layer 2, free magnetic layer 1, backed layer 15 and protective layer 7 are deposited on the antiferromagnetic layer 4.

As hitherto described, the seed layer 22 comprises the crystalline phase formed of Cr, and the orientation of the crystal face in one region in the seed layer 22 may be different from the orientation of the crystal face in another region in the seed layer. In other words, the orientation of the crystal face in one crystal grain in the seed layer 22 may be different from the orientation of the crystal face in another crystal grain in the seed layer 22.

Accordingly, wettability of the surface of the seed layer 22 is enhanced, and each layer formed on the seed layer 22 becomes ready for lamellar growth. Since the crystal grain size increases, the unidirectional exchange bias magnetic field (Hex*) as well as the rate of change of resistance (ΔR/R) may be larger than those in the related art while enabling lubricity of the surface of each layer formed on the seed layer 22 to be improved. Consequently, the interlayer coupling magnetic field ($H_{in}$) acting between the pinned magnetic layer 3 and free magnetic layer 1 may be reduced, thereby enabling the magnetic sensing element having small asymmetry of the regenerative waveform.

EXAMPLES

The layer structure of the seed layer, and crystalline state of the antiferromagnetic layer formed on the seed layer were investigated in the example using the seed layer made of Cr, and in the comparative example made of the NiFeCr alloy.

The layer structure in the example comprises, from the bottom to the top, Si substrate/alumina(1000)/seed layer: Cr(60)/antiferromagnetic layer: $Pt_{50\,at\,\%}Mn_{50\,at\,\%}$(120)/pinned magnetic layer: [$Co_{90\,at\,\%}Fe_{10\,at\,\%}$(16)/Ru(9)/$Co_{90\,at\,\%}Fe_{10\,at\,\%}$(22)]/nonmagnetic layer: Cu(21)/free magnetic layer: [$Co_{90\,at\,\%}Fe_{10\,at\,\%}$(10)/$Ni_{80\,at\,\%}Fe_{20\,at\,\%}$/$Ni_{80\,at\,\%}Fe_{20\,at\,\%}$(18)]/backed layer: Cu(10)/Protective layer: Ta(30). The figure in the parenthesis denotes the thickness of each layer in angstrom unit.

Each layer after deposition by sputtering was heat treated at 290° C. for about 4 hours in a magnetic field of 800 kA/m.

The layer structure in the comparative example comprises, from the bottom to the top, Si substrate/alumina (1000)/underlayer: Ta(32)/seed layer: $(Ni_{0.8}Fe_{0.2})_{60\,at\,\%}Cr_{40\,at\,\%}$/antiferromagnetic layer: $Pt_{50\,at\,\%}Mn_{50\,at\,\%}$(200)/pinned magnetic layer: [$Co_{90\,at\,\%}Fe_{10\,at\,\%}$(15)/Ru(9)/$Co_{90\,at\,\%}Fe_{10\,at\,\%}$(22)]/nonmagnetic layer: Cu(21)/free magnetic layer: [$Co_{90\,at\,\%}Fe_{10\,at\,\%}$(10)/Ni80 at %Fe20 at %(32)]/backed layer: Cu(17)/protective layer: Ta(20). The figure in the parenthesis denotes the thickness of each layer in angstrom unit.

Each layer after deposition by sputtering was heat treated at 290° C. for about 4 hours in a magnetic field of 800 kA/m.

Figure 6:
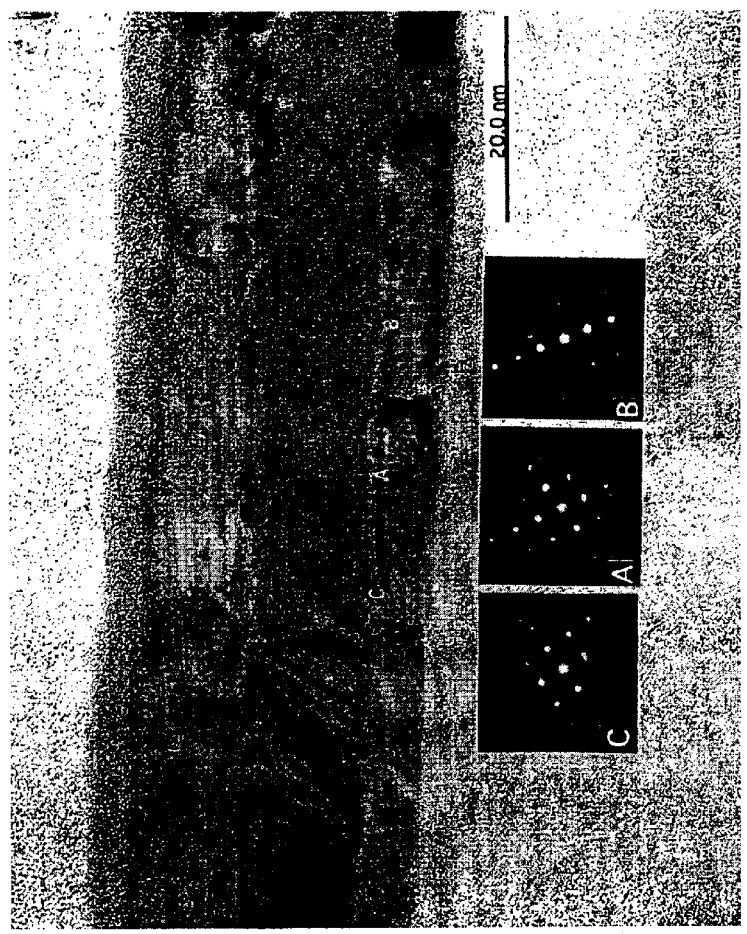
FIG. 6 shows a transmission electron microscopic photograph of the magnetic sensing element having a Cr seed layer with a thickness of 60 Å in the example, and an electron diffraction pattern of the seed layer.
Figure 7:
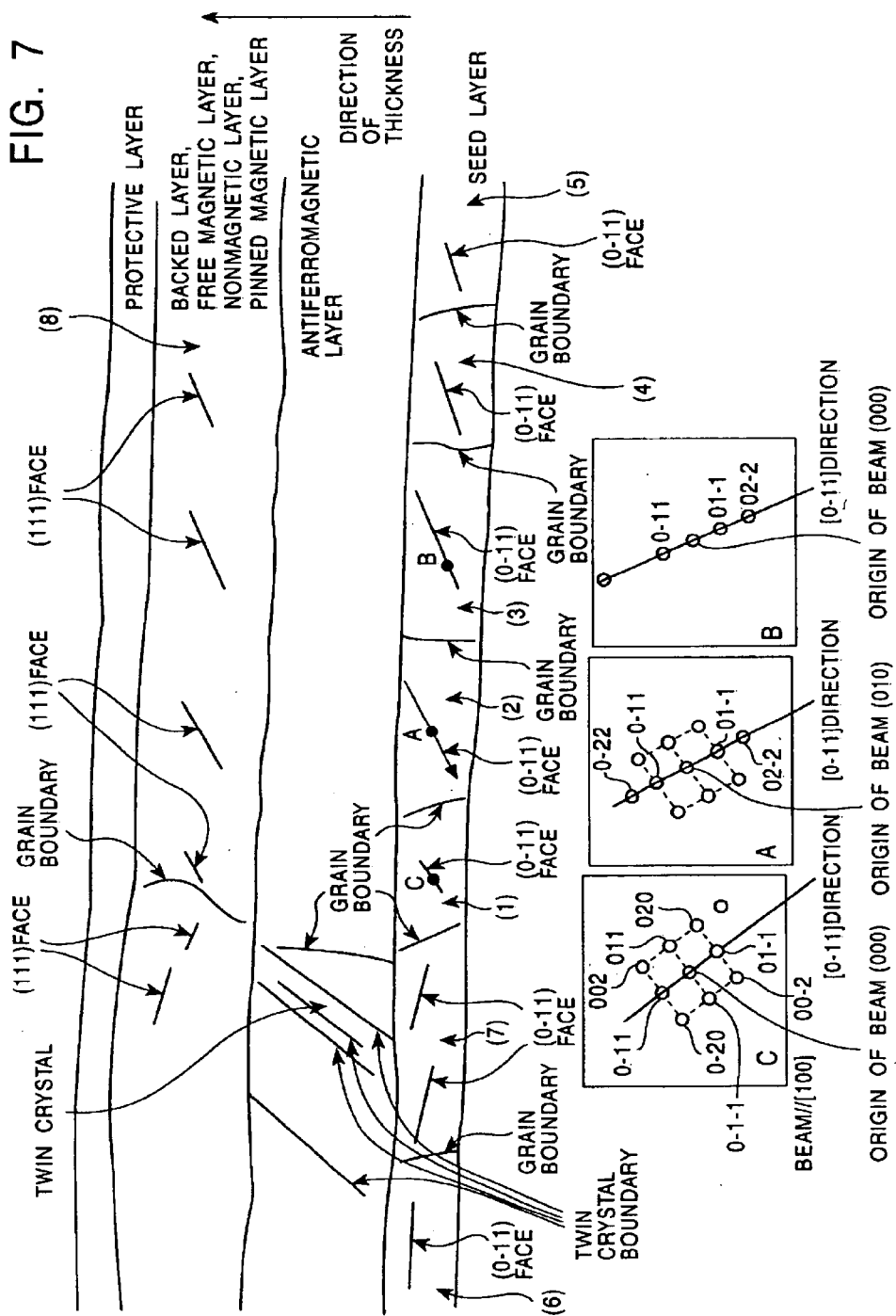
FIG. 7 is a schematic representation of a part of the photograph shown in FIG. 6.

FIG. 6 shows the transmission electron microscopic photograph of the magnetic sensing element having the layer structure in the example above, and FIG. 7 is a schematic representation of a part of the photograph shown in FIG. 6.

FIGS. 6 and 7 showed that the surface of the antiferromagnetic layer formed on the seed layer formed of Cr, and the surface of each layer such as the pinned magnetic layer formed on the antiferromagnetic layer exhibit small undulations with quite excellent lubricity of the surface of each layer.

It was also shown that the crystal grains on the surface of each layer formed on the seed layer 22 had grown with a mean crystal grain diameter of about 200 Å in the direction parallel to the surface of the layer.

FIGS. 6 and 7 also show that the crystal grain boundaries in the antiferromagnetic layer are discontinuous to the grain boundaries in the pinned magnetic layer formed on the antiferromagnetic layer at the interface between the layers.

Likewise, the crystal grain boundaries in the seed layer are discontinuous to the crystal grain boundaries in the antiferromagnetic layer at the interface between the layers as shown in FIGS. 6 and 7.

It was also shown that twin crystals are formed in the antiferromagnetic layer, and the twin crystal boundaries are formed to be non-parallel to the interface between the antiferromagnetic layer and seed layer.

Plural crystal grain boundaries are formed in the seed layer as shown in FIGS. 6 and 7.

As shown in FIG. 7, the (0-11) face appearing in the crystal grain (1) is oriented in a direction inclined toward the upper right relative to the direction parallel to the layer surface. The (0-11) face refers to a crystal face (real lattice face: reciprocal lattice point in the diffraction pattern) represented by the Miler indices in the single crystal structure.

The (0-11) faces appearing in the crystal grains (2) and (3) are also oriented in approximately the same direction as the (0-11) face in the crystal grain (1). Strictly speaking, however, the orientations are not completely matched with each other as will be described later with reference to the electron diffraction pattern, and their orientations are different with each other to some extent.

The (0-11) face appearing in the crystal grain (6) is clearly oriented, on the contrary, to be more parallel to the layer face as compared with the (0-11) faces in the crystal grains (1), (2) and (3). In other words, crystal orientation of the crystal grain (6) in the direction parallel to the (0-11) face is different from crystal orientations of the (0-11) faces in the crystal grains (1), (2) and (3).

The (0-11) faces appearing in the crystal grains (4) and (5) were shown to be oriented in approximately the same direction as the orientation of the (0-11) faces in the crystal grains (1), (2) and (3).

The (0-11) face appearing in the crystal grain (7) is oriented, different from the (0-11) faces appearing in the crystal grains (1) to (6), in a direction inclined toward the upper left relative to the direction parallel to the layer surface, showing that the crystal orientation of the (0-11) face in the crystal grain (7) is quite different from the crystal orientations of the (0-11) faces appearing in the crystal grains (1) to (6).

The seed layer according to the present invention comprises at least a crystalline phase, and the orientation of the crystal face in one region of the seed layer is different from the orientation of the crystal face in another region of the seed layer.

In other words, the orientation of the crystal face in one crystal grain in the seed layer is different from the orientation of the crystal face in another crystal grain in the seed layer.

For investigating crystallinity of the (0-11) faces appearing in the crystal grains (1), (2) and (3), electron beam diffraction patterns at the site C in the grain (1), at the site A in the grain (2) and at the site B in the grain (3) were measured. The electron beam diffraction patterns at the sites A, B and C are attached under the electron microscopic photograph in FIG. 6.

FIG. 6 shows that plural diffraction spots are seen in the three electron beam diffraction patterns at the sites A, B and C. The locations of these diffraction spots may indicate the orientation of each(0-11) face.

As shown in FIG. 7, the origin of the beam on the diffraction pattern and each diffraction spot corresponding to the reciprocal lattice point representing each (0-11) face are connected with a line. Virtual lines (showing the [0-11] direction as a crystal axis perpendicular to the (0-11) face) obtained showed that the crystal orientations are shifted with each other to a certain extent at the sites A, B and C.

The virtual line at the site A is inclined by 64 degree from the direction parallel to the layer surface, the virtual line at the site B is inclined by 67 degree from the direction parallel to the layer surface, and the virtual line at the site A is inclined by 54 degree from the direction parallel to the layer surface. Accordingly, the angle between each virtual line and the line normal to the layer surface is 45 degree or less.

The shift angle of each virtual line at the sites A, B or C is about 15 degree or less in maximum. A shift angle of zero means that the orientations of the (0-11) faces are the same at respective sites. However, the orientation of the (0-11) face appearing in each grain boundary is not so different with each other as will be clear in the electron microscopic photograph of the crystal grains at the sites A, B and C, indicating that the crystal faces are oriented in approximately the same direction.

The electron beam diffraction patterns at the sites A, B and C in FIGS. 6 and 7 show that different diffraction spots other than those showing the (0-11) face are seen in respective diffraction patterns, and the positions showing these different diffraction spots are largely different among the diffraction patterns.

The diffraction pattern having a tetragonal symmetry (square symmetry) at the site C shows that the [100] direction in the (0-11) face is oriented to be parallel to the direction of the beam. Since the square frame is distorted at the site A, on the other hand, the (0-11) face is twisted in a different direction from the direction at the site C, or is twisted around the axis [0-11]. The diffraction pattern at the site B is quite different from those at the sites A and C except the diffraction spots oriented in the [0-11] direction, showing that the crystal face is oriented in a different direction (an orientation twisted around the axis [0-11]) from those at the sites A and C.

The results described above show that, although the (0-11) faces at the sites A, B and C are oriented in approximately the same direction with each other, each (0-11) face is rotated around an axis perpendicular to each (0-11) face. Consequently, diffraction spots indicating the crystal faces other than the (0-11) faces are seen in respective diffraction spots.

The following conclusions may be elucidated from the experimental results as hitherto described. Equivalent crystal faces in the seed layer are oriented approximately in the same direction in at least two crystal grains, and at least a part of the equivalent crystal axes laying in these crystal faces are oriented in different directions with each other.

When the equivalent crystal faces are differently rotated (twisted) among the crystal grains, the atoms constituting the antiferromagnetic layer formed on the seed layer do not in a 1:1 correspondence state, or in a non-coherent state, with the Cr atoms constituting the seed layer. Consequently, the antiferromagnetic layer can properly transform from the disordered lattice to the ordered lattice, enabling a large exchange coupling magnetic field to be manifested between the antiferromagnetic layer and pinned magnetic layer.

It was shown from FIGS. 6 and 7 that the orientation of the {110} face formed in the seed layer approximately matches the orientation of the {110} face in each layer such as the pinned magnetic layer, nonmagnetic layer and free magnetic layer formed above the antiferromagnetic layer in the direction of the layer thickness.

This is probably because the orientation of each {111} face in the antiferromagnetic layer, pinned magnetic layer, nonmagnetic layer and free magnetic layer approximately matches the orientation of the {110} face in the seed layer immediately after depositing the antiferromagnetic layer, pinned magnetic layer, nonmagnetic layer and free magnetic layer on the seed layer.

However, since the antiferromagnetic layer is in the non-coherent state at the interfaces on the seed layer and pinned magnetic layer, the antiferromagnetic layer is properly transferred from the disordered lattice to the ordered lattice by heat treatment with a change of the crystal orientation. Accordingly, no crystal faces matching the orientation of the {110} face on the seed layer in the direction of thickness appear in the antiferromagnetic layer as shown in FIGS. 6 and 7.

Since the crystal orientation remains unchanged by heat treatment in each layer deposited above the antiferromagnetic layer, the orientation of each {111} face in the pinned magnetic layer, nonmagnetic layer or free magnetic layer also matches both in the direction of the {110} face of the seed layer and in the direction of thickness.

As shown in FIG. 7, the (111) faces in the grain (8) formed in the pinned magnetic layer, nonmagnetic layer and free magnetic layer are parallel with each other without any angular shift. It is also shown that the crystal grain (8) is grown as a large crystal grain extending across the crystal grains (1), (2), (3), (4) and (5) in the seed layer. This fact also suggests that the seed layer and antiferromagnetic layer have grown in a non-coherent state with each other.

A large crystal can grow on the seed layer across plural crystals formed in the seed layer with twisted crystal orientations with each other mainly because the seed layer has good wettability.

Since the upper layer on the seed layer grows irrespective of grain boundaries formed on the seed layer, grain boundary steps are suppressed from appearing in the pinned magnetic layer, nonmagnetic layer and free magnetic layer, thereby permitting these layers with good lubricity.

The seed layer shown in FIG. 6 was formed with a thickness of as large as 60 Å. Since lattice stripes are seen all over the seed layer shown in FIG. 6, the seed layer is thought to be composed of the crystalline phase only. The crystalline phase had the body-centered cubic structure (bcc structure).

Figure 8:
FIG. 8 shows a transmission electron microscopic photograph of the magnetic sensing element when a seed layer in the comparative example comprising a NiFeCr layer containing 40 at % of Cr and having a thickness of 55 Å is formed on a Ta layer.
Figure 9:
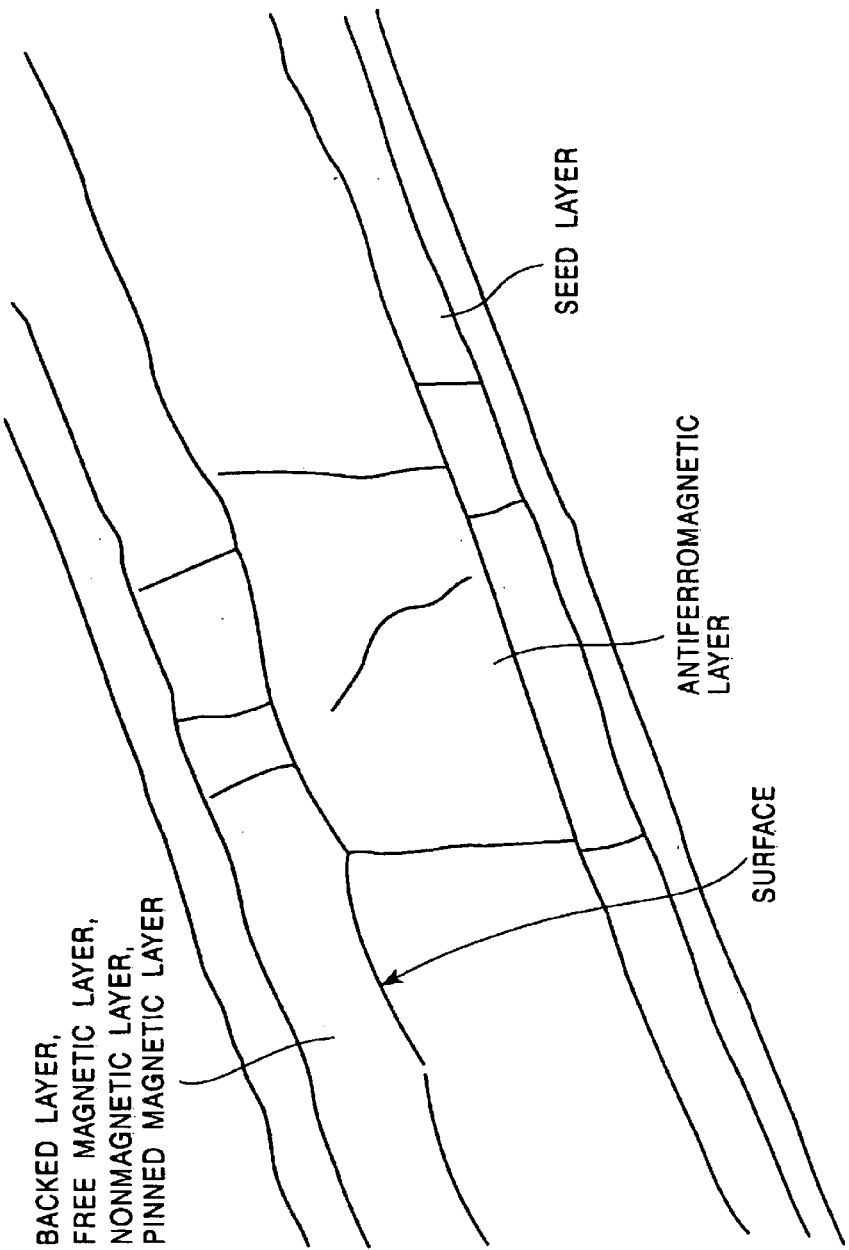
FIG. 9 is a schematic representation of a part of the photograph shown in FIG. 8.

FIG. 8 shows a transmission electron microscopic photograph of the magnetic sensing element having the layer structure in the comparative example. FIG. 9 is a schematic representation of a part of the transmission electron microscopic photograph shown in FIG. 8.

Undulations on the surface of each layer such as the antiferromagnetic layer formed on the seed layer made of the NiFeCr alloy as shown in FIGS. 8 and 9 are severe with not so good lubricity of the surface as compared with those in the examples in FIGS. 6 and 7. The {111} faces were predominantly oriented in the direction parallel to the surface of the layer in the seed layer shown in FIGS. 8 and 9. The seed layer has the face-centered cubic structure (fcc structure).

Comparisons of the example in FIGS. 6 and 7 with the comparative example in FIGS. 8 and 9 show that the surface of the antiferromagnetic layer, and the surface of each layer such as the pinned magnetic layer formed on the antiferromagnetic layer have excellent lubricity as compared with those in the comparative example.

It was also shown that the orientation of the crystal face in one crystal grain in the seed layer formed of Cr is different from the orientation of the crystal face in another crystal grain in the seed layer. This means crystallinity of the seed layer in the example is different from that in the comparative example. In other words, the orientation of the crystal face in one crystal grain on the surface of the seed layer is different from the orientation of the crystal face in another crystal grain on the surface of the seed layer, and the orientation of the crystal face in at least one region of the seed layer is different from the orientation of the crystal face in another region of the seed layer.

The unidirectional exchange bias magnetic field (Hex*), interlayer coupling magnetic field ($H_{in}$), rate of change of resistance ($\Delta R/R$) and mean crystal diameter in the example (referred to as Example 2 hereinafter) and in the comparative example (referred to as Comparative Example 1 hereinafter) are summarized in the table below.

The experimental results with respect to the magnetic sensing element having the layer structure shown below are also summarized in the table as Example 1 and Comparative Example 2.

The layer construction in Example 1 comprises, from the bottom to the top, Si substrate/alumina(1000)/underlayer: Ta(32)/seed layer: Cr(60)/antiferromagnetic layer: $Pt_{50\ at\ \%}Mn_{50\ at\ \%}(120)$/pinned magnetic layer: $[Co_{90\ at\ \%}Fe_{10\ at\ \%}(16)/Ru(9)/Co_{90\ at\ \%}Fe_{10\ at\ \%}(22)]$/nonmagnetic layer: Cu(21)/free magnetic layer: $[Co_{90\ at\ \%}Fe_{10\ at\ \%}(10)/Ni_{80\ at\ \%}Fe_{20\ at\ \%}(18)]$/backed layer: Cu(10)/Protective layer: Ta(30). The figure in the parenthesis denotes the thickness of each layer in angstrom unit.

Each layer after deposition by sputtering was heat treated at 290° C. for about 4 hours in a magnetic field of 800 kA/m.

The layer construction in Comparative Example 1 comprises, from the bottom to the top, Si substrate/alumina (1000)/underlayer: Ta(32)/antiferromagnetic layer: $Pt_{50\ at\ \%}Mn_{50\ at\ \%}(120)$/pinned magnetic layer: $[Co_{90\ at\ \%}Fe_{10\ at\ \%}(15)/Ru(9)/Co_{90\ at\ \%}Fe_{10\ at\ \%}(22)]$/nonmagnetic layer: Cu(21)/free magnetic layer: $[Co_{90\ at\ \%}Fe_{10\ at\ \%}(10)/Ni_{80\ at\ \%}Fe_{20\ at\ \%}(32)]$/backed layer: Cu(17)/protective layer: Ta(20). The figure in the parenthesis denotes the thickness of each layer in angstrom unit.

Each layer after deposition by sputtering was heat treated at 290° C. for about 4 hours in a magnetic field of 800 kA/m.

As shown in the layer structure above, the seed layer is formed on the underlayer in Example 1. No seed layer is formed in Comparative Example 2, although the underlayer is formed.

TABLE 1

| | TEM PHOTO-GRAPH | LAYER CON-STRUC-TION | ANNEALING CONDITION | UNDERLAYER/ SEED LAYER | CRYSTAL STRUC-TURE OF SEED LAYER | UNDIREC-TIONAL EXCHANGE BIAS MAGNETIC FIELD (Oe) A/m | $\Delta R/R$ (%) | INTER-LAYER COUPLING MAGNETIC FIELD (Oe) A/m | MEAN CRYSTAL GRAIN DIAMETER IN LAYER DIRECTION |
|---|---|---|---|---|---|---|---|---|---|
| EXAMPLE 1 | NONE | #1 | HEAT TREATMENT IN MAGNETIC FIELD 290° C. × 3 hr. 40 min 800 kA/m | Ta (32Å)/ Cr (60Å) | bcc-Cr (main) | 1926 Oe 1.5 × 10⁵ A/m | 9.56% | 0.7 Oe 55.3 A/m | 211Å |
| EXAMPLE 2 | FIG. 6 | #2 | HEAT TREATMENT IN MAGNETIC FIELD 290° C. × 3 hr. 40 min 800 kA/m | Cr (60Å) | bcc-Cr (main) | 1937 Oe 1.53 × 10⁵ A/m | 8.72% | 4.6 Oe 363.4 A/m | 202Å |
| COM-PARATIVE EXAMPLE 1 | FIG. 8 | #3 | HEAT TREATMENT IN MAGNETIC FIELD 290° C. × 3 hr. 40 min 800 kA/m | Ta (32Å)/ $(Ni_{0.8}Fe_{0.2})_{60}Cr_{40}$ (55Å) | fcc | 1773 Oe 1.4 × 10⁵ A/m | 11.8% | 7.8 Oe 616.2 A/m | 182Å |

TABLE 1-continued

| | TEM PHOTO-GRAPH | LAYER CON-STRUC-TION | ANNEALING CONDITION | UNDERLAYER/ SEED LAYER | CRYSTAL STRUCTURE OF SEED LAYER | UNDIRECTIONAL EXCHANGE BIAS MAGNETIC FIELD (Oe) A/m | ΔR/R (%) | INTERLAYER COUPLING MAGNETIC FIELD (Oe) A/m | MEAN CRYSTAL GRAIN DIAMETER IN LAYER DIRECTION |
|---|---|---|---|---|---|---|---|---|---|
| COMPARATIVE EXAMPLE 2 | NONE | #4 | HEAT TREATMENT IN MAGNETIC FIELD 290° C. × 3 hr. 40 min 800 kA/m | Ta (32Å) | — | 987 Oe 0.78 × 10⁵ A/m | 8.72% | 8.5 Oe 671.5 A/m | — |

1 Si substrate/alumina (1000Å)/Ta (32Å)/Cr (60Å)/$Pt_{50}Mn_{50}$ (120Å)/$Co_{90}Fe_{10}$ (16Å)/Ru (9Å)/$Co_{90}Fe_{10}$ (22Å)/Cu (21Å)/$Co_{90}Fe_{10}$ (10Å)/$Ni_{80}Fe_{20}$ (18Å)/Cu (10Å)/Ta (30Å)
2 Si substrate/alumina (1000Å)/Cr (60Å)/$Pt_{50}Mn_{50}$ (120Å)/$Co_{90}Fe_{10}$ (16Å)/Ru (9Å)/$Co_{90}Fe_{10}$ (22Å)/Cu (21Å)/$Co_{90}Fe_{10}$ (10Å)/$Ni_{80}Fe_{20}$ (18Å)/Cu (10Å)/Ta (30Å)
3 Si substrate/alumina (1000Å)/Ta (32Å)/$(Ni_{0.8}Fe_{0.2})_{60}Cr_{40}$ (55Å)/$Pt_{50}Mn_{50}$ (200Å)/$Co_{90}Fe_{10}$ (15Å)/Ru (9Å)/$Co_{90}Fe_{10}$ (22Å)/Cu (21Å)/$Co_{90}Fe_{10}$ (10Å)/$Ni_{80}Fe_{20}$ (32Å)/Cu (17Å)/Ta (20Å)
4 Si substrate/alumina (1000Å)/Ta (32Å)/$Pt_{50}Mn_{50}$ (120Å)/$Co_{90}Fe_{10}$ (15Å)/Ru (9Å)/$Co_{90}Fe_{10}$ (22Å)/Cu (21Å)/$Co_{90}Fe_{10}$ (10Å)/$Ni_{80}Fe_{20}$ (32Å)/Cu (17Å)/Ta (20Å)

As shown in Table 1, the crystal structures of the seed layers in Examples 1 and 2 mainly comprise the body-centered cubic structure (bcc structure).

Table 1 shows that the unidirectional exchange bias magnetic fields (Hex*) in Examples 1 and 2 are higher than those in Comparative examples 1 and 2. This is probably because wettability of the surface of the seed layer was markedly improved by using Cr for the seed layer while increasing the crystal grain diameter in each layer formed on the seed layer.

Although the rate of change of resistance (ΔR/R) is the highest in Comparative Examples 1, a rate of change of resistance of 9 to 10% was ensured in Examples 1 and 2, which is of no problem in high density recording in the future, A large rate of change of resistance (ΔR/R) is obtainable in Examples 1 and 2 partly because the crystal grain diameter in each layer formed on the seed layer is large. The mean crystal grain diameters listed in the right end column in the table are 211 Å and 202 Å in Examples 1 and 2, resectively, which are larger than the crystal grain diameter in Compsarative Example 1. The preferable mean crystal grain diameter was determined to be 200 Å or more in the present invention from the experimental results in the table.

The interlayer coupling magnetic field ($H_{in}$) will be described hereinafter. The interlayer coupling magnetic field ($H_{in}$) refers to as the ferromagnetic coupling magnetic field between the free magnetic layer and pinned magnetic layer with intervention of the nonmagnetic layer. A coupling force to direct the magnetization direction of the free magnetic layer in the direction parallel to the direction of magnetization of the pinned magnetic layer is appied when $H_{in}$ is positive, while a coupling force to direct the magnetization direction of the free magnetic layer in the direction antiparallel to the direction of magnetization of the pinned magnetic layer is appied when $H_{in}$ is negative.

Magnetization of the free magnetic layer is readily aligned in the direction that intersects the direction of magnetization of the pinned layer by reducing the interlayer coupling magnetic field ($H_{in}$), thereby enabling asymmetry of the generative waveform to be reduced.

Table 1 shows that the interlayer coupling magnetic field ($H_{in}$) is smaller in Examples 1 and 2 than in Comparative Examples 1 and 2.

The interlayer coupling magnetic field ($H_{in}$) may be reduced in Examples 1 and 2 because the surface of each layer formed on the seed layer is less undulated in Examples than in Comparative examples, showing that lubricity is excellent as illustrated in FIGS. 6 to 9.

A magnetic sensing element comprising the layer structure below was formed using a seed layer formed of Cr, and the preferable range of the thickness of the seed layer was determined from the relations among the unidirectional exchange bias magnetic field, rate of change of resistance and interlayer coupling magnetic field ($H_{in}$) in the pinned magnetic layer.

The layer structure used in the experiment comprises, from the bottom to the top, substrate/seed layer: Cr(X)/ antiferromagnetic layer: PtMn(120)/pinned magnetic layer: [CoFe(16)/Ru(8.7)/CoFe(22)]/nonmagnetic layer: Cu(21)/ free magnetic layer: [CoFe(10)/$Ni_{81.5\ at\ \%}Fe_{18.5\ at\ \%}$(18)]/ free magnetic layer: [CoFe(10)/$Ni_{81.5\ at\ \%}Fe_{18.5\ at\ \%}$(18)]/ backed layer: Cu(10)/protective layer: Ta(30). The figure in the parenthesis denotes the thickness of each layer in angstrom unit.

The experiment was performed using the magnetic element having the Ta layer between the seed layer and substrate.

The pressure of the Ar gas introduced for depositing the seed layer formed of Cr by sputtering was adjusted to 1 mTorr, electricity supplied to the sputtering apparatus was adjusted to 100 W, and the distance between the target and substrate was adjusted at 7 cm.

After depositing the magnetic sensing element with the layer construction above, it was annealed at 290° C. for about 4 hours in a magnetic field of 800 kA/m.

Figure 10:
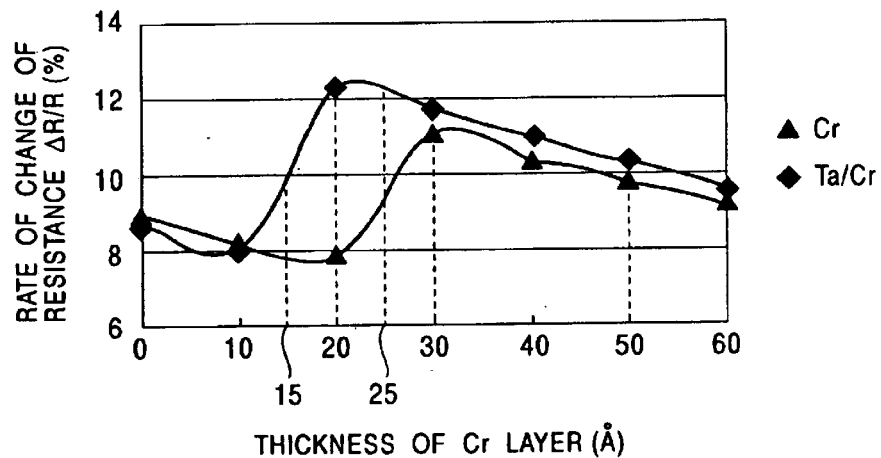
FIG. 10 is a graph showing the relations between the thickness of the seed layer and rate of change of resistance of the Cr seed layer and Cr seed layer formed on the Ta layer, respectively.

FIG. 10 is a graph showing the relation between the thickness of the seed layer formed of Cr and the rate of change of resistance (ΔR/R).

It is shown from the experimental results using the [Ta/Cr] layer comprising the Ta layer under the seed layer as shown in FIG. 10 that a rate of change of resistance of about 9% or more can be obtained when the thickness of the Cr layer is 15 Å or more and 60 Å or less.

It is also shown that a rate of change of resistance of about 9% or more may be obtained when the thickness of the Cr layer is 20 Å or more and 60 Å or less, or 50 Å or more and 60 Å or less.

The rate of change of resistance will be decreased when the thickness of the Cr layer is larger than 60 Å, because the proportion of shunt of the sense current to the seed layer 22 increases.

The lower limit of the thickness of the seed layer was determined to be 15 Å partly because, when the thickness of the seed layer 22 is smaller than 15 Å, the layer cannot be densely grown with uniform thickness, thereby failing in exhibiting wettability and planarity of the surface while decreasing the degree of crystal orientation as well as the mean crystal grain diameter of the antiferromagnetic layer and ferromagnetic layer laminated on the seed layer 22.

The experimental results using the [Cr] layer having no Ta layer under the seed layer showed that a rate of change of resistance of about 9% or more may be obtained when the thickness of the Cr layer is 25 Å or more and 60 Å or less.

It is also shown that a rate of change of resistance of about 9% may be obtained even when the thickness of the Cr layer is 30 Å or more and 60 Å or less, or 50 Å or more and 60 Å or less.

The lower limit of the thickness of the seed layer was determined to be 25 Å or less partly because, when no Ta layer is provided under the seed layer, the seed layer 22 cannot be densely grown with a uniform thickness when the thickness of the seed layer is less than 25 Å to result in poor wettability and planarity of the seed layer 22, thereby reducing the degree of crystal orientation as well as the mean crystal grain diameter of the antiferromagnetic layer and ferromagnetic layer formed on the seed layer.

Figure 11:
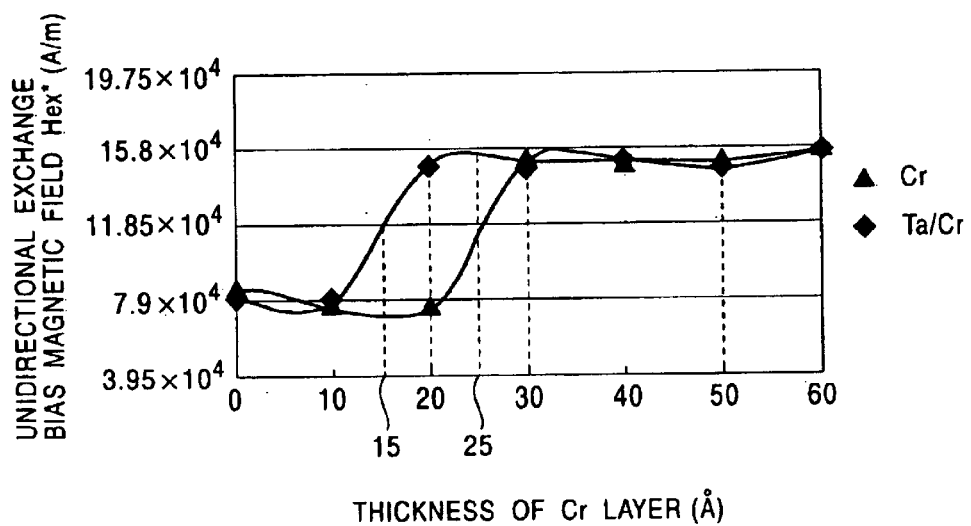
FIG. 11 is a graph showing the relations between the thickness of the seed layer and unidirectional exchange bias magnetic field of the Cr seed layer and Cr seed layer formed on the Ta layer, respectively.

FIG. 11 is a graph showing the relation between the unidirectional exchange bias magnetic field (Hex*) and thickness of the seed layer formed of Cr.

The experimental results using the [Ta/Cr] layer having the Ta layer under the seed layer formed of Cr in FIG. 11 show that a unidirectional exchange bias magnetic field (Hex*) of about $11.85 \times 10^4$ A/m may be obtained when the thickness of the Cr layer is 15 Å or more.

It was also shown that a higher unidirectional exchange bias magnetic field (Hex*) of about $15.8 \times 10^4$ A/m (2000 Oe) can be obtained when the thickness of the Crlayer is 20 Å or more.

The experimental results using the [Cr layer] with no Ta layer under the seed layer show that a unidirectional exchange bias magnetic field (Hex*) of about $11.85 \times 10^4$ A/m may be obtained when the thickness of the Cr layer is 25 Å or more.

It is also shown that the unidirectional exchange bias magnetic field (Hex*) may be further increased to about $15.8 \times 10^4$ A/m (2000 Oe) when the thickness of the Cr layer is 30 Å or more.

It was shown from the experimental results of the unidirectional exchange bias magnetic field (Hex*) shown in FIG. 11 that the unidirectional exchange bias magnetic field (Hex*) decreases even by further increasing the thickness of the seed layer as shown in the experimental results of the rate of change of resistance in FIG. 10.

Figure 12:
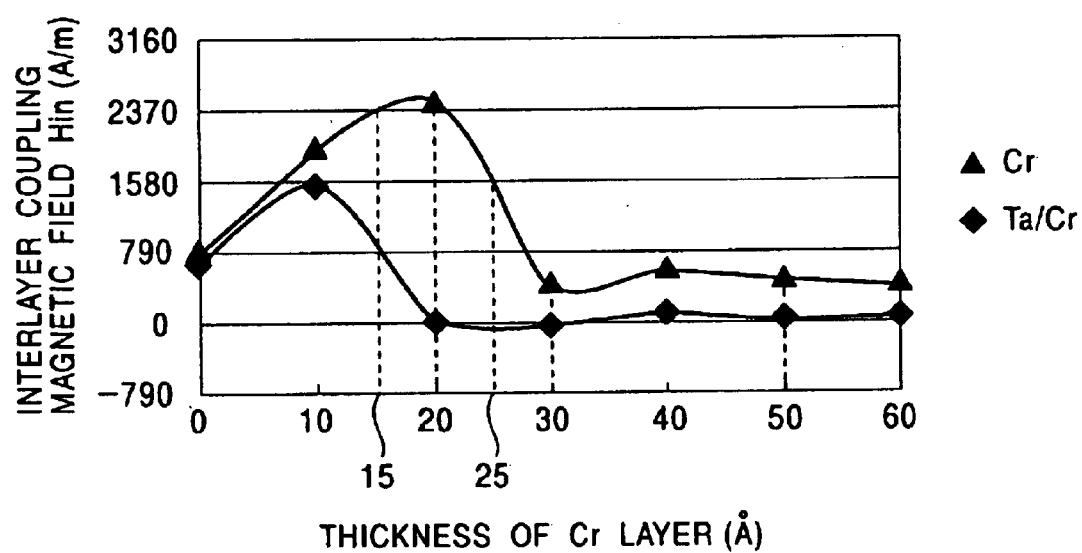
FIG. 12 is a graph showing the relations between the thickness of the seed layer and interlayer coupling magnetic field ($H_{in}$) of the Cr seed layer and Cr seed layer formed on the Ta layer, respectively.
Figure 13:
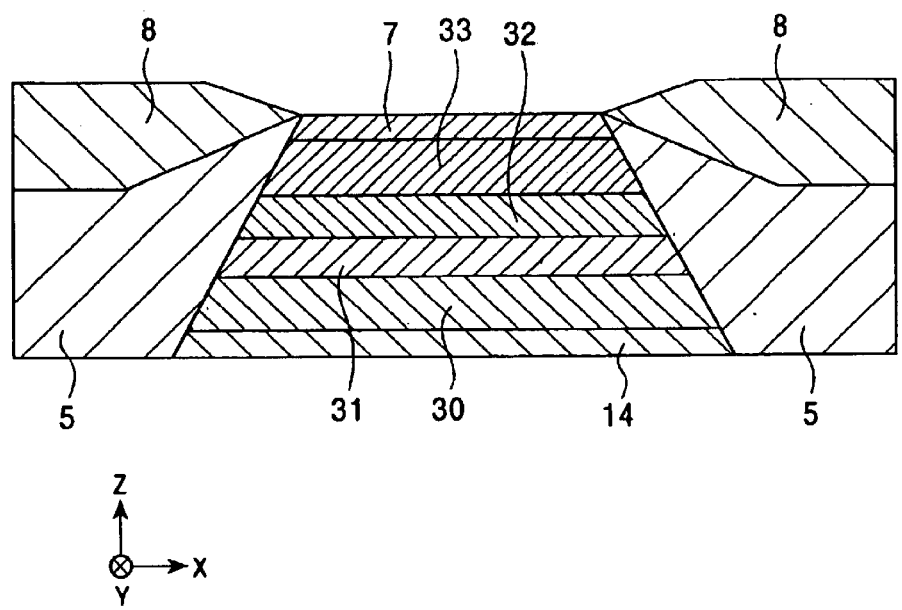
FIG. 13 is a partial cross section of the conventional magnetic sensing element viewed from a opposed face side to a recording medium.
Figure 14:
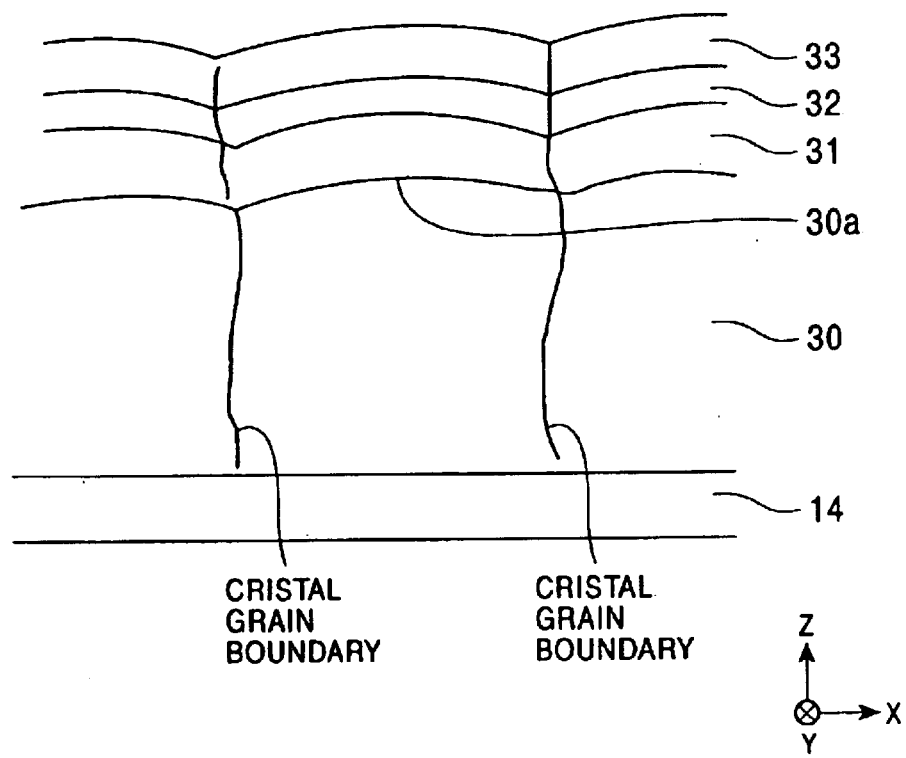
FIG. 14 is a partial schematic drawing for indicating a partially magnified layer structure of the magnetic sensing element shown in FIG. 13.
Figure 15:
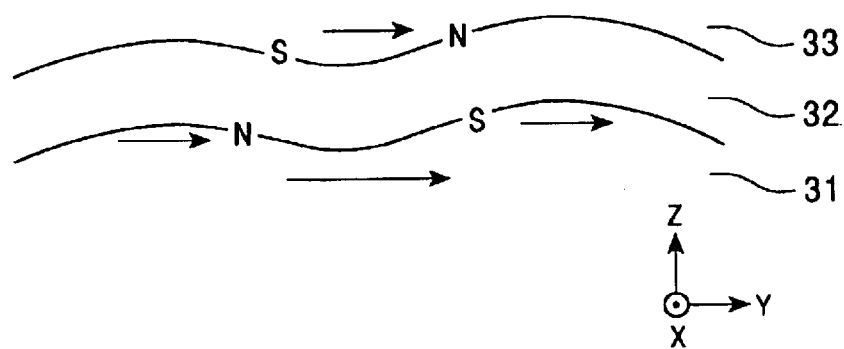
FIG. 15 is a partial schematic drawing for indicating a partially magnified layer structure of the pinned magnetic layer, nonmagnetic layer and free magnetic layer shown in FIG. 14.

FIG. 12 is a graph showing the relation between the thickness of the seed layer and the interlayer coupling magnetic field ($H_{in}$).

The experimental results using the [Ta/Cr] layer having the Ta layer under the seed layer in FIG. 12 show that an interlayer coupling magnetic field ($H_{in}$) of 790 A/m or less is obtained when the thickness of the seed layer is 15 Å or more.

It is also shown that the interlayer coupling magnetic field ($H_{in}$) comes close to about zero A/m when the thickness of the seed layer is 20 Å or more.

The experimental results using the [Cr] layer having no Ta layer under the seed layer show that an interlayer coupling magnetic field ($H_{in}$) of 1580 A/m may be obtained when the thickness of the seed layer is 25 Å or more.

It is shown to be preferable to form the seed layer with a thickness of 30 Å or more for allowing the interlayer coupling magnetic field ($H_{in}$) to come close to zero A/m.

A thickness of the seed layer of 50 Å or more permits the interlayer coupling magnetic field ($H_{in}$) to come more close to zero A/m. This is because the entire seed layer may comprise the bcc crystal structure by forming the seed layer with a thickness of 50 Å or more. Consequently, the orientation of the crystal face in at least one region in the seed layer is different from the orientation of the crystal face in another region in the seed layer. Since the crystal faces are rotated around the crystal axis perpendicular to respective crystal faces with each other, at least a part of the equivalent crystal axes (for example, the <011> axis when the crystal face is {110} face) in the crystal face have in different orientations with each other. Consequently, lubricity of the surface of each layer formed on the seed layer has been further improved.

The thickness of the Cr layer was determined to be 15 Å or more and 60 Å or less in the present invention from the experimental results as hitherto described. The thickness within this range permits a rate of change of resistance of 9% or more to be obtained.

It is more preferable that the thickness of the Cr layer is 20 Å or more and 60 Å or less. The thickness of this range permits the rate of change of resistance of 9% or more and unidirectional exchange bias magnetic field (Hex*) of $15.8 \times 10^4$ A/m or more to be obtained. The interlayer coupling magnetic field ($H_{in}$) may be set close to zero A/m.

The thickness of the Cr layer is determined to be 25 Å or more and 60 Å or less when no Ta layer is provided under the seedlayer. The thickness of this range permits the rate of change of resistance of 9% or more to be obtained. It is more preferable that the thickness of the Cr layer is in the range of 30 Å or more and 60 Å or less. The thickness of this range permits the rate of change of resistance of 95% or more as well as the unidirectional exchange bias magnetic field (Hex*) of about $15.8 \times 10^4$ A/m to be obtained. The interlayer coupling magnetic field ($H_{in}$) may also come close to zero A/m.

It is preferable in the present invention to form the seed layer with a thickness of 50 Å or more, thereby enabling a more smaller interlayer coupling magnetic field ($H_{in}$) to be obtained.

As hitherto described, the exchange coupling film is made of Cr with at least a crystalline phase in the seed layer. The orientation of the crystal face in at least in one area in the seed layer is different from the orientation of the crystal face in another region in the seed layer. For example, the orientation of the crystal face in at least in one crystal grain in the seed layer is different from the orientation of the crystal face in another crystal grain in the seed layer.

Wettability of the surface of the seed layer may be remarkably improved in the present invention as compared with the conventional seed layer formed of the NiFeCr alloy. Accordingly, each layer deposited on the seed layer such as the antiferromagnetic layer may be readily grown as lamellae with a larger crystal grain diameter, thereby further increasing the magnitude of the unidirectional exchange bias magnetic field (Hex*) in the ferromagnetic layer as compared with that when the seed layer is formed of the NiFeCr alloy.

Increasing the unidirectional exchange bias magnetic field allows the ferromagnetic layer to be properly pinned in a desired direction, and magnetization of the ferromagnetic layer may remain fixed in the desired direction even in a high temperature environment.

Grain boundary diffusion along the crystal grain boundaries between the layers may be suppressed by increasing the crystal grain diameter in each layer deposited on the seed layer, thereby enabling electromigration resistance represented by electromigration resistance to be properly improved.

In addition to remarkable improvement of wettability of the surface of the seed layer, undulations on the surface of each layer formed on the seed layer may be suppressed to enable lubricity of the surface to be properly improved.

When the exchange coupling film is used as a magnetic sensing element, the ferromagnetic coupling magnetic field (interlayer coupling magnetic field, $H_{in}$) generated by static magnetic coupling (topological coupling) between the pinned magnetic layer (ferromagnetic layer) and free magnetic layer as well as asymmetry of the regenerative wave form may be reduced. When the specular reflection layer is formed, the rate of change of resistance may be improved by improving specular reflectivity of the specular reflection layer.

According to the exchange coupling film and magnetic sensing element using the exchange coupling film in the present invention, wettability of the seed layer may be remarkably improved while improving lubricity of the surface of each layer formed on the seed layer. Consequently, the unidirectional exchange bias magnetic field (Hex*) is increased and electromigration resistance in high density recording in the future is improved, thereby enabling stability of the regenerative waveform as well as the rate of change of resistance to be imoroved.

What is claimed is:

1. An exchange coupling film comprising a seed layer, an antiferromagnetic layer and a ferromagnetic layer sequentially laminated from bottom to top, a magnetization direction of the ferromagnetic layer being aligned in a given direction by generating an exchange coupling magnetic field at an interface between the antiferromagnetic layer and ferromagnetic layer,
   wherein the seed layer has at least a crystalline phase and comprises Cr, and at least a direction of a crystal face in one region of the seed layer is oriented in a different direction from a crystal face in a different region from said one region, and
   diffraction spots corresponding to reciprocal lattice points representing equivalent crystal faces are seen in electron diffraction patterns measured at said one region and another region, a shift of an inclined angle of each virtual line from a line normal to a layer surface obtained by connecting each diffraction spot and an origin of an electron beam is within an angle of zero to 45 degree, and one of crystal axes in the particular crystal face and at least a part of equivalent crystal axes are oriented in different directions with each other.

2. An exchange coupling film according to claim 1, wherein a direction of a crystal face on a surface of the seed layer of one crystal grain is oriented in a different direction from the direction of a crystal face on a surface of the seed layer of another crystal grain.

3. An exchange coupling film according to claim 1, wherein the crystal faces are equivalent crystal faces represented by a [110] face.

4. An exchange coupling film according to claim 1, wherein an underlayer comprising at least one element of Ta, Hf, Nb, Zr, Ti, Mo and W is formed under the seed layer, the seed layer having a thickness of at least 15 Å and at most 60 Å.

5. An exchange coupling film according to claim 4, wherein the thickness of the seed layer is at least 20 Å and at most 60 Å.

6. An exchange coupling film according to claim 4, wherein the thickness of the seed layer is at least 50 Å and at most 60 Å.

7. An exchange coupling film according to claim 1, wherein an underlayer comprising at least one element of Ta, Hf, Nb, Zr, Ti, Mo and W is not formed under the seed layer, the seed layer having a thickness of at least 25 Å and at most 60 Å.

8. An exchange coupling film according to claim 7, wherein the thickness of the seed layer is at least 30 Å and at most 60 Å.

9. An exchange coupling film according to claim 7, wherein the thickness of the seed layer is at least 50 Å and at most 60 Å.

10. An exchange coupling film according to claim 1, wherein the ferromagnetic layer comprises a specular reflection layer.

11. An exchange coupling film according to claim 1, wherein a mean crystal grain diameter in a direction parallel to a layer face of crystal grains formed on each layer on the seed layer is at least 200 Å.

12. An exchange coupling film according to claim 1, wherein crystal grain boundaries formed in the antiferromagnetic layer exposed on a cross section by cutting the exchange coupling film in a direction parallel to a thickness of the film is discontinuous to crystal grains formed in the ferromagnetic layer at least at a part of the interface between the antiferromagnetic layer and ferromagnetic layer.

13. An exchange coupling film according to claim 1, wherein crystal grain boundaries formed in the antiferromagnetic layer exposed on a cross section by cutting the exchange coupling film in a direction parallel to a thickness of the film is discontinuous to crystal grains formed in the seed layer at least at a part of an interface between the antiferromagnetic layer and seed layer.

14. An exchange coupling film according to claim 1, wherein twin crystals are formed in at least a part of the antiferromagnetic layer, and twin crystal boundaries are formed in at least a part of the twin crystal to be non-parallel to an interface at the seed layer.

15. An exchange coupling film according to claim 1, wherein the antiferromagnetic layer contains an antiferromagnetic material comprising an element X (X denotes at least one element of Pt, Pd, Ir, Rh, Ru and Os) and Mn.

16. An exchange coupling film according to claim 15, wherein the antiferromagnetic material comprises X—Mn—X' and composition ratio of one of the element X and elements X+X' is at least 45 at % and at most 60 at %.

17. An exchange coupling film according to claim 1, wherein the antiferromagnetic layer comprises a X—Mn—X' alloy (the element X' denotes at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pt and rare earth elements).

18. An exchange coupling film according to claim 17, wherein one of the X—Mn—X' alloy is an invasion type solid solution in which the element X' invades in interstices of a space lattice formed by the element X and Mn, and the X—Mn—X' alloy is a substitution type solid solution in which a part of the lattice points formed of element X and Mn are substituted with the element X'.

19. An exchange coupling film according to claim 17, wherein a composition ratio of one of element X and elements X+X' is at least 45 at % and at most 60 at %.

20. A magnetic sensing element comprising a seed layer, an antiferromagnetic layer, a pinned magnetic layer, a nonmagnetic layer and a free layer sequentially laminated from bottom to top, magnetization of the free magnetic layer being aligned in a direction to intersect magnetization of the pinned magnetic layer,
wherein the seed layer, antiferromagnetic layer and pinned magnetic layer are formed of the exchange coupling film according to claim 1.

21. A magnetic sensing element according to claim 20, wherein a specular layer is additionally formed at an opposed side to the nonmagnetic layer in contact with the free magnetic layer.

22. A magnetic sensing element comprising a seed layer, an antiferromagnetic exchange bias layer, a free layer, a nonmagnetic layer, a pinned magnetic layer and an antiferromagnetic layer sequentially laminated from bottom to top, magnetization of the free magnetic layer being aligned in a direction to intersect magnetization of the pinned magnetic layer,
wherein the seed layer, exchange bias layer and free magnetic layer are formed of the exchange coupling film according to claim 1.

23. A magnetic sensing element according to claim 22, wherein a specular reflection layer is further formed at an opposed side to the nonmagnetic layer in contact with the free magnetic layer.

24. A magnetic sensing element comprising nonmagnetic layers laminated on and under the free magnetic layer, respectively, pinned magnetic layers formed on one of a nonmagnetic layer and under another nonmagnetic layer, respectively, and antiferromagnetic layers formed on one of the first of the pinned magnetic layers and under a second of the pinned magnetic layers, respectively, a seed layer being formed under the antiferromagnetic layer formed below the free magnetic layer, and magnetization of the free magnetic layer being aligned in a direction intersecting magnetization of first of the pinned magnetic layers,
wherein the seed layer, and the antiferromagnetic layer and pinned magnetic layer bonded on the seed layer are formed of the exchange coupling film according to claim 1.

25. A magnetic sensing element according to claim 24, wherein the ferromagnetic layer comprises a specular reflection layer.

26. A magnetic sensing element comprising a seed layer, an antiferromagnetic exchange bias layer, a magnetoresistive layer, a nonmagnetic layer and a soft magnetic layer sequentially laminated from bottom to top,
wherein the seed layer, exchange bias layer and magnetoresistive layer are formed of the exchange coupling film according to claim 1.

27. An exchange coupling film comprising a seed layer, an antiferromagnetic layer of a ferromagnetic layer sequentially laminated from bottom to top, a magnetization direction of the ferromagnetic layer being aligned in a given direction by generating an exchange coupling magnetic field at an interface between the antiferromagnetic layer and ferromagnetic layer,
wherein the seed layer has at least a crystalline phase and comprises Cr, at least a direction of a crystal face in a first region of the seed layer is oriented in a different direction from a crystal face in a second region, and the crystal faces are equivalent crystal faces represented by a [110] face.

28. An exchange coupling film according to claim 27, wherein a direction of a crystal face on a surface of the seed layer of one crystal grain is oriented in a different direction from a direction of a crystal face on a surface of the seed layer of another crystal grain.

29. An exchange coupling film according to claim 27, wherein an underlayer comprising at least one element of Ta, Hf, Nb, Zr, Ti, Mo and W is formed under the seed layer, and the seed layer has a thickness of at least 15 Å and at most 60 Å.

30. An exchange coupling film according to claim 29, wherein the thickness of the seed layer is at least 20 Å and at most 60 Å.

31. An exchange coupling film according to claim 29, wherein the thickness of the seed layer is at least 50 Å and at most 60 Å.

32. An exchange coupling film according to claim 27, wherein an underlayer comprising at least one element of Ta, Hf, Nb, Zr, Ti, Mo and W is not formed under the seed layer, and the seed layer has a thickness of at least 25 Å and at most 60 Å.

33. An exchange coupling film according to claim 32, wherein the thickness of the seed layer is at least 30 Å and at most 60 Å.

34. An exchange coupling film according to claim 32, wherein the thickness of the seed layer is at least 50 Å and at most 60 Å.

35. An exchange coupling film according to claim 27, wherein the ferromagnetic layer comprises a specular reflection layer.

36. An exchange coupling film according to claim 27, wherein a mean crystal grain diameter in a direction parallel to a layer face of crystal grains formed on each layer on the seed layer is at least 200 Å.

37. An exchange coupling film according to claim 27, wherein crystal grain boundaries formed in the antiferromagnetic layer exposed on a cross section by cutting the exchange coupling film in a direction parallel to a thickness of the film is discontinuous to crystal grains formed in the ferromagnetic layer at least at a part of the interface between the antiferromagnetic layer and ferromagnetic layer.

38. An exchange coupling film according to claim 27, wherein crystal grain boundaries formed in the antiferromagnetic layer exposed on a cross section by cutting the exchange coupling film in a direction parallel to a thickness of the film is discontinuous to crystal grains formed in the seed layer at least at a part of an interface between the antiferromagnetic layer and seed layer.

39. An exchange coupling film according to claim 27, wherein twin crystals are formed in at least a part of the antiferromagnetic layer, and twin crystal boundaries are formed in at least a part of the twin crystal to be non-parallel to an interface at the seed layer.

40. An exchange coupling film according to claim 27, wherein the antiferromagnetic layer comprises an antiferromagnetic material comprising an element X (X denotes at least one element of Pt, Pd, Ir, Rh, Ru and Os) and Mn.

41. An exchange coupling film according to claim 40, wherein the antiferromagnetic material comprises X—Mn—X' and composition ratio of one of the element X and elements X+X' is at least 45 at % and at most 60 at %.

42. An exchange coupling film according to claim 27, wherein the antiferromagnetic layer comprises a X—Mn—X' alloy (the element X' denotes at least one element of Ne, Ar, Kr, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pt and rare earth elements.

43. An exchange coupling film according to claim 42, wherein one of the X—Mn—X' alloy is an invasion type solid solution in which the element X' invades in interstices of a space lattice formed by the element X and Mn, and the X—Mn—X' alloy is a substitution type solid solution in which a part of the lattice points formed of element X and Mn are substituted with the element X'.

44. An exchange coupling film according to claim 42, wherein a composition ratio of one of element X and elements X+X' is at least 45 at % and at most 60 at %.

45. A magnetic sensing element comprising a seed layer, an antiferromagnetic layer, a pinned magnetic layer, a nonmagnetic layer and a free layer sequentially laminated from bottom to top, magnetization of the free magnetic layer being aligned in a direction to intersect magnetization of the pinned magnetic layer, wherein the seed layer, antiferromagnetic layer and pinned magnetic layer are formed of the exchange coupling film according to claim 27.

46. A magnetic sensing element according to claim 45, wherein a specular layer is additionally formed at an opposed side to the nonmagnetic layer in contact with the free magnetic layer.

47. A magnetic sensing element comprising a seed layer, an antiferromagnetic exchange bias layer, a free layer, a nonmagnetic layer, a pinned magnetic layer and an antiferromagnetic layer sequentially laminated from bottom to top, magnetization of the free magnetic layer being aligned in a direction to intersect magnetization of the pinned magnetic layer, wherein the seed layer, exchange bias layer and free magnetic layer are formed of the exchange coupling film according to claim 27.

48. A magnetic sensing element according to claim 47, wherein a specular reflection layer is further formed at an opposed side to the nonmagnetic layer in contact with the free magnetic layer.

49. A magnetic sensing element comprising nonmagnetic layers laminated on and under free magnetic layer, respectively, pinned magnetic layers formed on one of a nonmagnetic layer and under another nonmagnetic layer, respectively, and antiferromagnetic layers formed on one of the first of the pinned magnetic layers and under a second of the pinned magnetic layers, respectively, a seed layer being formed under the antiferromagnetic layer formed below the free magnetic layer, and magnetization of the free magnetic layer being aligned in a direction intersecting magnetization of the first of the pinned magnetic layers, wherein the seed layer, and the antiferromagnetic layer and pinned magnetic layer bonded on the seed layer are formed of the exchange coupling film according to claim 27.

50. A magnetic sensing element according to claim 49, wherein the ferromagnetic layer comprises a specular reflection layer.

51. A magnetic sensing element comprising a seed layer, an antiferromagnetic exchange bias layer, a magnetoresistive layer, a nonmagnetic layer and a soft magnetic layer sequentially laminated from bottom to top, wherein the seed layer, exchange bias layer and magnetoresistive layer are formed of the exchange coupling film according to claim 27.

* * * * *

UNITED STATES PATENT AND TRADEMARK OFFICE
CERTIFICATE OF CORRECTION

PATENT NO. : 6,853,521 B2
DATED : February 8, 2005
INVENTOR(S) : Naoya Hasegawa et al.

It is certified that error appears in the above-identified patent and that said Letters Patent is hereby corrected as shown below:

Column 40,
Line 65, before "Be, B, C," insert -- Xe, --.

Signed and Sealed this

Thirty-first Day of May, 2005

JON W. DUDAS
*Director of the United States Patent and Trademark Office*